United States Patent
Houston

(10) Patent No.: US 7,400,523 B2
(45) Date of Patent: Jul. 15, 2008

(54) 8T SRAM CELL WITH HIGHER VOLTAGE ON THE READ WL

(75) Inventor: Theodore Warren Houston, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 6 days.

(21) Appl. No.: 11/445,428

(22) Filed: Jun. 1, 2006

(65) Prior Publication Data

US 2007/0279966 A1 Dec. 6, 2007

(51) Int. Cl.
G11C 11/00 (2006.01)
(52) U.S. Cl. .................. 365/154; 365/189.15; 257/327
(58) Field of Classification Search .................. 365/154
See application file for complete search history.

(56) References Cited

U.S. PATENT DOCUMENTS

| | | | |
|---|---|---|---|
| 6,091,626 A | 7/2000 | Madan | |
| 6,687,145 B2 | 2/2004 | Houston | |
| 6,744,661 B1 * | 6/2004 | Shubat | 365/156 |
| 6,791,864 B2 | 9/2004 | Houston | |
| 6,975,532 B1 | 12/2005 | Kosonocky et al. | |
| 7,123,504 B2 * | 10/2006 | Yabe | 365/156 |
| 2001/0028591 A1 * | 10/2001 | Yamauchi | 365/227 |
| 2005/0265070 A1 | 12/2005 | Liaw | |
| 2006/0002223 A1 * | 1/2006 | Song et al. | 365/226 |
| 2006/0227595 A1 * | 10/2006 | Chuang et al. | 365/154 |

OTHER PUBLICATIONS

U.S. Appl. No. 11/202,141, filed Aug. 11, 2005, Houston.

* cited by examiner

*Primary Examiner*—Hoai V. Ho
*Assistant Examiner*—Anthan T Tran
(74) *Attorney, Agent, or Firm*—Wade J. Brady, III; Frederick J. Telecky, Jr.

(57) ABSTRACT

The present invention provides circuitry for writing to and reading from an SRAM cell core, an SRAM cell, and an SRAM device. In one aspect, the circuitry includes a write circuit coupled to the SRAM cell core that includes a write transistor gated by a write word line. The circuitry also includes a read buffer circuit coupled to the SRAM cell core to read the cell without disturbing the state of the cell. The read buffer circuit includes a read transistor gated by a read word line, the read transistor coupled between a read bit-line and a read driver transistor that is further coupled to a voltage source Vss. The read driver transistor and a first driver transistor of the cell core are both gated by one output of the cell core. The read transistor has an electrical characteristic that differs from that of the core cell first driver transistor.

19 Claims, 14 Drawing Sheets

8T SRAM CELL WITH HIGHER VOLTAGE ON THE READ WL

FIELD OF INVENTION

The present invention relates generally to semiconductor memory devices, and more particularly to an improved stability SRAM memory cell having a read buffer circuit that permits a higher read voltage and current isolated from the latch nodes of the cell during read operations while permitting a lower write voltage that avoid upsets to the cell during write operations.

BACKGROUND OF THE INVENTION

Current trends in the semiconductor and electronics industry require memory devices to be made smaller, faster and require less power consumption. One reason for these trends is that more personal devices are being manufactured that are relatively small and portable, thereby relying on battery power. In addition to being smaller and more portable, personal devices are also requiring increased memory and more computational power and speed. In light of all these trends, there is an ever increasing demand in the industry for smaller, faster, and lower power dissipation memory cells and transistors used to provide the core functionality of these memory devices.

Semiconductor memories can, for example, be characterized as volatile random access memories (RAMs) or nonvolatile read only memories (ROMs), where RAMs can either be static (SRAM) or dynamic (DRAM) differing mainly in the manner by which they store a state of a bit. In SRAM, for example, each memory cell includes transistor-based circuitry that implements a bistable latch, which relies on transistor gain and positive (e.g., reinforcing) feedback so that it can only assume one of two possible states, namely on (state 1) or off (state 2). The latch can only be programmed or induced to change from one state to the other through the application of a voltage or other external stimuli. This arrangement is desirable for a memory cell since a state written to the cell will be retained until the cell is reprogrammed.

DRAMs on the other hand implement a capacitor that is either charged or discharged to store the on (state 1) or off (state 2) state of a cell. Capacitors discharge over time, however, and DRAMs must therefore be periodically 'refreshed'. Also, a bistable latch can generally be switched between states much faster than the amount of time it takes to charge or discharge a capacitor. Accordingly, SRAMs are a desirable type of memory for certain types of applications including portable devices such as laptop computers and personal digital assistants (PDAs).

SRAM is typically arranged as a matrix of thousands of individual memory cells fabricated in an integrated circuit chip, and address decoding in the chip allows access to each cell for read/write functions. SRAM memory cells use active feedback from cross-coupled inverters in the form of a latch to store or "latch" a bit of information. These SRAM memory cells are often arranged in rows and columns so that blocks of data such as words or bytes can be written or read simultaneously. Standard SRAM memory cells have many variations.

The basic CMOS SRAM cell generally includes two n-type or n-channel (nMOS) pull-down or drive transistors and two p-type (pMOS) pull-up or load transistors in a cross-coupled inverter configuration, which act as a bistable latch circuit, with two additional nMOS select or pass-gate transistors added to make up a six-transistor cell (a 6T cell). Additionally, application specific SRAM cells can include an even greater number of transistors. A plurality of transistors are utilized in SRAM requiring matched electrical characteristics to provide predictable cell switching characteristics, reliable circuit performance, and minimize array power dissipation.

Each inverter of the SRAM memory cell includes a load transistor and a driver transistor. The output of the two inverters provide opposite states of the latch, except during transitions form one state to another. The pass-gate transistors provide access to the cross-coupled inverters during a read operation (READ) or write operation (WRITE). The gate inputs of the pass transistors are typically connected in common to a word line (wordline or WL). The drain of one pass transistor is connected to a bit line (bitline or BL), while the drain of the other pass transistor is connected to the logical complement of the bit line (bitline-bar or BLB).

A WRITE to a 6T cell is effected by asserting a desired value on the BL and a complement of that value on BLB, and asserting the WL. Thus, the prior state of the cross-coupled inverters is overwritten with a current value. A READ is effected by initially precharging both bitlines to a logical high state and then asserting the WL. In this case, the output of one of the inverters in the SRAM cell will pull one bitline lower than its precharged value. A sense amplifier detects the differential voltage on the bitlines to produce a logical "one" or "zero," depending on the internally stored state of the SRAM cell.

Accordingly, a consideration in the design of the transistors in the SRAM cell is the geometric parameters of the transistors. The gate length and width determine in large part the speed and saturation drive current, $I_{Dsat}$, also known as the maximum drive current capacity of the transistors. Appropriate values of gate length and width of the six transistors of the 6T cell must be chosen to ensure that a read operation does not destroy the previously stored datum. Inappropriate transistor parameter values in conjunction with the BL and WL voltages applied during a READ may result in a change in state of the memory cell due to random asymmetries resulting from imperfections in the manufacturing process. The necessity to guard against such READ instability places an undesirable constraint on the design parameters of the transistors in the 6T cell, limiting the ability of the designer to increase READ performance of the SRAM while keeping within area and power constraints and maintaining the ability to write into the cell.

As transistor scaling trends continue, however, it becomes increasingly difficult to design an SRAM cell that has both adequate static noise margin (SNM) and adequate trip voltage (Vtrip), because of their interdependency in cell design. For example, a design constraint of a 6T SRAM cell is that the pass gate is generally designed to be relatively weaker than the inverter driver transistor to ensure stability and adequate SNM, yet is also designed to be stronger than the inverter load transistor to enable a WRITE by providing adequate Vtrip. Also, for stability, the inverter load transistor cannot be too weak relative to the inverter driver transistor or SNM is degraded. Inverter transistors with relatively low threshold voltage (Vt), the voltage at which the transistor begins to conduct, may also degrade stability of the SRAM cell. With technology scaling to the 45 nm node and beyond, it may no longer be possible to achieve this balance in the relative strengths of the pass gate, drive, and load transistors over the desired range of temperature and bias conditions as well as process variations. Thus, the current balance in these design values often involves a trade-off that may translate to a higher incidence of data upsets and/or slower access times.

Prior art includes methods to assist the WRITE to allow the relatively weaker pass gate for good stability. This prior art includes pulling the BL below the SRAM low voltage supply, $V_{SS}$, for WRITE, or providing a lower SRAM high voltage supply, $V_{DD}$, to the inverters for WRITE relative to that for READ. However, the relatively weaker pass gate enabled by this prior art has the undesirable affect of degrading the read current.

Prior art also includes memory cells with separate ports for READ and WRITE that might at first seem to relax some of the constraints to allow a fast READ. However, such cells are generally relatively large. Also there is still the constraint of not upsetting the unaddressed cells in a selected row for WRITE in an array in which only a subset of the cells in a selected row are written into in a single WRITE cycle. The cells in the selected row that are not written into are subjected to bias conditions similar to that for a READ, and are subject to upset.

Accordingly, there is a need for an improved SRAM cell design that enables independent optimization of the static noise margin, trip voltage, and read current of higher speed SRAM cells, while minimizing data upsets in SRAM memory devices with a relatively compact layout.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later. The invention relates to an SRAM memory cell structure (e.g., an 8T single ended and a 10T differential SRAM memory cell) utilizing a read buffer circuit or read circuit comprising a read transistor for cell selection and coupling to a read bit line when gated by a read word line, and a read driver transistor that is gated by an output of a cell core for removing or isolating the read current from the latch nodes of the cell during read operations. Beneficially, the read buffer permits a higher read current isolated from the latch nodes of the cell during read operations while permitting a lower write voltage that avoid upsets to the cell during write operations.

The read buffer circuit is configured to permit a dedicated read word line (RWL) for read operations and a separate write word line (WWL) for accessing the core cell during write operations. Accordingly, the independent read and write word lines permit different voltages on the read word line RWL and write word line WWL for optimizing read current while avoiding data upsets. For example, a relatively higher voltage may be used on the RWL to obtain more read current, and a relatively lower voltage on the WWL to avoid upsets.

In one aspect of the invention, the RWL voltage may be boosted above Vdd during read operations while the WWL voltage is kept at Vss or 0 volts. During write operations, the WWL voltage may be switched to Vdd while the RWL voltage is kept at Vss or 0 volts.

In another aspect of the invention, the RWL voltage may be driven to Vdd during read operations while the WWL voltage is kept at Vss or 0 volts. During write operations, the WWL voltage may be kept below Vdd while the RWL voltage is kept at Vss or 0 volts.

In still another aspect of the invention, the RWL voltage during read operations may be the same as the WWL voltage during write operations.

In yet another aspect of the invention, the array Vss is raised to enable the write operation with a lower WWL voltage during write operations, while the RWL voltage is boosted during read operations to compensate for the impact of raised Vss on the read current, using a Vss clamp diode connected between a source terminal of the core cells of the array (Vss-array) and a source voltage (Vss).

The SRAM memory cell structure of the present invention allows independent optimization of the static noise margin, trip voltage, and read current, thereby avoiding some of the static noise margin and trip voltage problems of conventional SRAM cells (e.g., a conventional 6T differential cell). The structures described herein are applicable to silicon wafer fabrication and other such fabrication processes in the manufacture of semiconductor memory devices.

In one aspect of the invention, the SRAM cell comprises a differential core cell, comprising first and second cross-coupled inverters, the first inverter having a first latch node and the second inverter having a second latch node. This inverter arrangement forms a latch used as the basic data storage cell, which includes two complementary or differential latch nodes. The SRAM cell of the present invention may further be configured having differential read buffers that provide a differential read mode. The differential read buffer configuration comprises a read buffer and a complementary read buffer, each buffer having a read transistor and a read driver transistor connected to and gated by the opposite latch node of the cell. The read driver transistor and the read transistor of each read buffer are series connected between a source voltage (Vss) at the source terminal of a read driver and a respective read bitline (RBL) or a complementary read bitline (read bitline bar, RBLB) at the drain terminal of the respective read transistor. The read and complementary read transistors are connected to a read wordline (RWL) for row (Y) access to the cell during read operations. The write transistors of the core cell are connected to a row (Y) decoder for access to the cells of a row of cells during write operations.

In accordance with still another aspect of the invention, the first and second inverters of the SRAM cell comprise a pull-up transistor and a pull-down transistor.

In another aspect, the present invention provides for an SRAM cell that has a pair of cross-coupled inverters, and a write transistor gated by a write word line (WWL) and coupled between the output of one of the cross-coupled inverters and a write bit-line (WBL). The SRAM cell also has a read transistor gated by a read word line (RWL) and coupled between a read bit-line (RBL) and a read driver transistor. The read driver transistor is coupled between the read transistor and a source voltage, and is gated by an output of one of the cross-coupled inverters.

In one aspect of the invention, the read buffer circuit comprises a read transistor that has an electrical characteristic which differs from that of the transistors used in the core cell.

In another aspect the electrical characteristic of the read transistor is a lower threshold voltage Vt or a shorter gate length.

In still another aspect the electrical characteristic of the read transistor is a maximum drive current, wherein the read transistor has a greater drive current than the write transistor.

In yet another aspect, the present invention provides an SRAM device, including an array of SRAM cells arranged in rows and columns. A write word line (WWL) is associated with at least one row for write operations, and is operable to control access to cells in the row for write operations. A write bit-line (WBL) is associated with at least one column, and is operable to provide input to the cells in the column for a write. A read word line (RWL) is associated with at least one row, and is operable to control access to cells in the row for read operations. A read bit-line (RBL) is associated with the column operable to receive output from cells in the column.

During the read operation of a conventional 6T SRAM cell, a read current is passed through a latch node of the selected data storage cell. The read current produces a voltage drop (Vdrop) across the associated pull-down transistor of the cell. This voltage drop requires the pull-down transistors to have a sufficiently high enough threshold voltage (Vt) to remain in the off-state during a read operation. Thus, measures to increase the read current of a conventional 6T SRAM cell without increasing area, such as reducing Vt or increasing the current capacity of the pass gate, tend to reduce cell stability.

Accordingly, a goal of the present invention is to provide a read current, which is indicative of the data state of the cell, yet removed from loading the data nodes or latch nodes of the cell. In accordance with the present invention, this goal is accomplished by adding a read buffer (e.g., a transistor, or another such read buffering circuit) outboard from the data cell that passes the read current. The control terminal (e.g., gate) of the read driver is connected to the opposite differential latch node of the cell. For example, the gate of a read driver transistor may be connected to the same node as the gate of the associated pull-down transistor of the SRAM cell.

Further, during a write operation of a conventional 6T SRAM cell, the wordline is asserted to all the cells associated with the selected wordline, including those cells that are not in selected columns. In particular, these unselected data bits reside along the selected wordline, but are in the other unselected columns of the array. As the selected cell or cells are written into, the data in the unselected cells along the selected wordline may be upset, and in addition may consume unnecessary supply power charging the unselected cells. Accordingly, a goal of the present invention is to permit concurrent optimization of the read current and stability of cells during WRITE, by providing a read pass gate transistor or read transistor gated by a read word line (RWL) for use during a read operation.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

DETAILED DESCRIPTION OF THE INVENTION

Figure 1A:
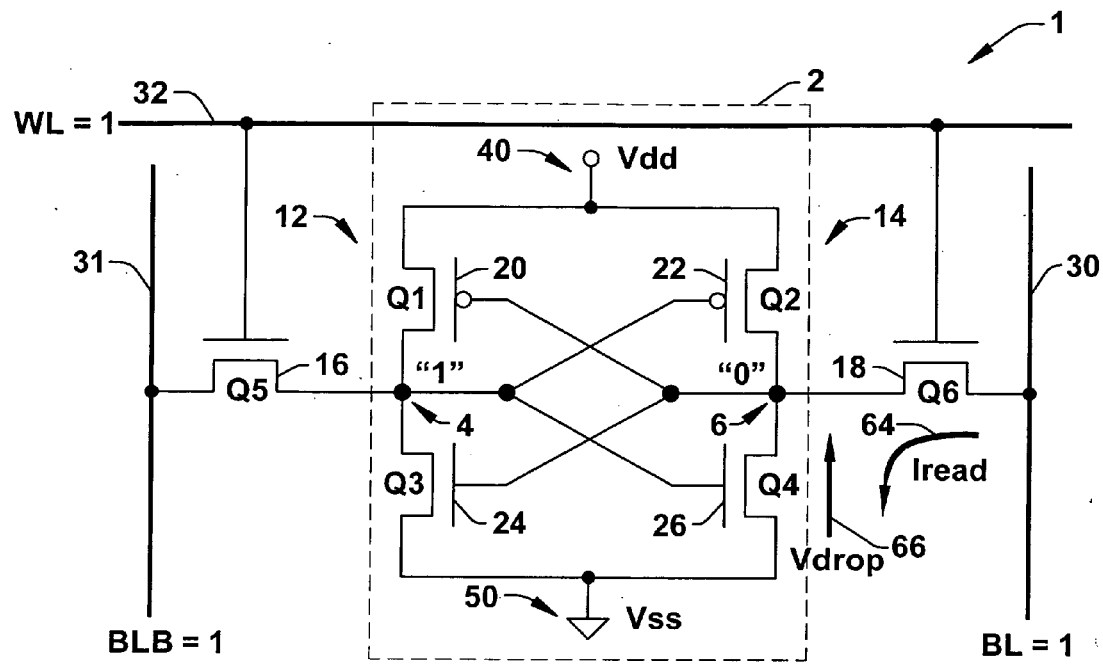
FIG. 1A is a schematic diagram of a conventional 6T static random access memory (SRAM) cell and SRAM core cell having a pair of output data nodes.

The present invention will now be described with reference to the attached drawings, wherein like reference numerals are used to refer to like elements throughout. The invention provides an SRAM memory cell structure (e.g., an 8T single ended and a 10T differential SRAM memory cell) utilizing a read buffer circuit for removing or isolating the read current from the latch nodes (data nodes) of the core cell or data cell during read operations, provides a separate read word line for selection of cell columns or a single cell during read operations, and provides a separate write word lines for selection of cell columns or a single cell during write operations.

Because the read current is isolated from the data storage cell of the present invention, the read drive current or maximum drive current through the read buffer may be increased over that which is often used in the write transistors of a conventional 6T differential cell. Further, the threshold voltage Vt used in the transistors of the read buffer may be lower than that used in the transistors of the core cell. Finally, the static noise margin (SNM), trip voltage (Vtrip), and read current (Iread) may be independently optimized, thereby avoiding some of the static noise margin and trip voltage compromises and problems of conventional SRAM cells (e.g., a conventional 6T differential cell).

The read buffer circuit of the present invention comprises a read transistor for selectively coupling a read current to a read bit line, RBL, associated with a column (X) of cells, when gated by a read word line RWL, and a read driver transistor that is gated by a latch node (output) of a cell core for modulating the read current according to the state of the cell.

With scaling, it is increasingly difficult to balance the requirements for being able to write into a cell without causing an upset of the cell. The read and write functions can be separated by adding a read buffer, but it is still necessary to be able to write without upset because of interleaving (having unaddressed columns in an addressed row). The ability to write without upset, leads to trade-offs in area and in read speed. It is possible to avoid upsets by using some combination of lower WL voltage, high Vt, and a write access transistor that is weaker than the cell driver transistor. However, such methods to avoid upsets tend to degrade performance (slower read due to low read current) and make the write more difficult. The difficulty in write can be overcome by write assist circuits, such as driving the write BL lower relative to the array VSS, however, this still leaves the performance low.

One aspect of the invention is to have a read buffer and to design the core 6T with transistor sizes, threshold voltages, and WL voltages that allow write without upset, but this would reduce the read current. The read buffer could then be designed with transistors that have different characteristics compared to the core 6T transistors to improve read current. Thus, the present invention not only addresses having the read driver transistor different from the core inverter driver transistor, but also includes having the read transistor different from the write transistor to avoid cell upsets and other advantages discussed herein.

Alternatively, the read WL may be separate from the write WL and a higher voltage may be used for the read operation.

Thus, the present invention contemplates both designing the core 6T to avoid upsets using a read buffer having transistors characteristics that are different from the transistors in the core 6T so as to improve Iread, and by using a lower voltage for the write WL relative to the read WL enhanced by write assist circuits. That is, the write assist circuits enable the write with the higher Vt's or the lower WL voltage.

As indicated previously, feature scaling trends continue down to around 45 nm areas or less, it may no longer be possible to achieve a balance in the relative strengths of the pass gate, drive, and load transistors over the desired range of temperature and bias conditions as well as process variations.

The inventors of the present invention have realized that the read current produces a voltage drop (Vdrop) across the associated pull-down transistor and latch node of the conventional cell, thereby raising the voltage of the respective latch node. This voltage drop requires the pull-down transistors to have a sufficiently high enough threshold voltage (Vt) to remain in the current data state during a read operation. As a result, the effective static noise margin (SNM) which remains (between the Vt and the Vdrop) is reduced and the data state of the selected cell may be more unstable. Accordingly, the inventors realized that the stability of the cell may be increased by removing or isolating the read current from the data cell using a read buffer (e.g., a transistor, or another such read buffering circuit). The read buffer of the present invention responds to the data state of the cell, but does not reflect the read current or the read current induced voltage drop back into the SRAM core cell or the opposite latch node which gates the read driver transistor of the read buffer. As a result, the interdependence between the SNM and the read current is removed from the data cell.

Further, the present invention avoids upsetting the unaddressed cells along an addressed wordline during a WRITE, by providing a relatively lower wordline voltage to the dedicated write word line WWL connected to the write pass gate or write transistors of a conventional 6T core cell. In addition, this arrangement may be useful to limit power dissipation in the array to the cell or cells that are accessed. Therefore, a relatively higher voltage may be used on the RWL to obtain more read current during READ operations, and a relatively lower voltage may be used on the WWL to avoid upsets during WRITE operations.

The inventors have also realized that the sizes and threshold voltages of the transistors of the core cell, the pass gates, and the read buffer may then be optimized. For example, to decrease the access time, the read current may be increased by increasing the size of the read transistor on the read word line RWL relative to that of the write transistors on the write word line WWL or the core driver transistors within the core cell.

Exemplary implementations are hereinafter illustrated and described in the context of fabricating SRAM cell structures to permit a higher voltage on the read word line RWL and to remove the interdependence between the SNM and the Vtrip of the conventional 6T SRAM cell in order to improve the optimization of a cell, and to avoid read and write data upsets, wherein the structures illustrated are not necessarily drawn to scale. It will be appreciated that the invention may be employed in the fabrication of SRAM memory devices, silicon wafer fabrication and other such fabrication processes in the manufacture of semiconductor memory devices, and other such processes apart from the exemplary memory structures described and illustrated herein. These and other benefits will become more apparent as the following figures are described infra.

Figure 1B:
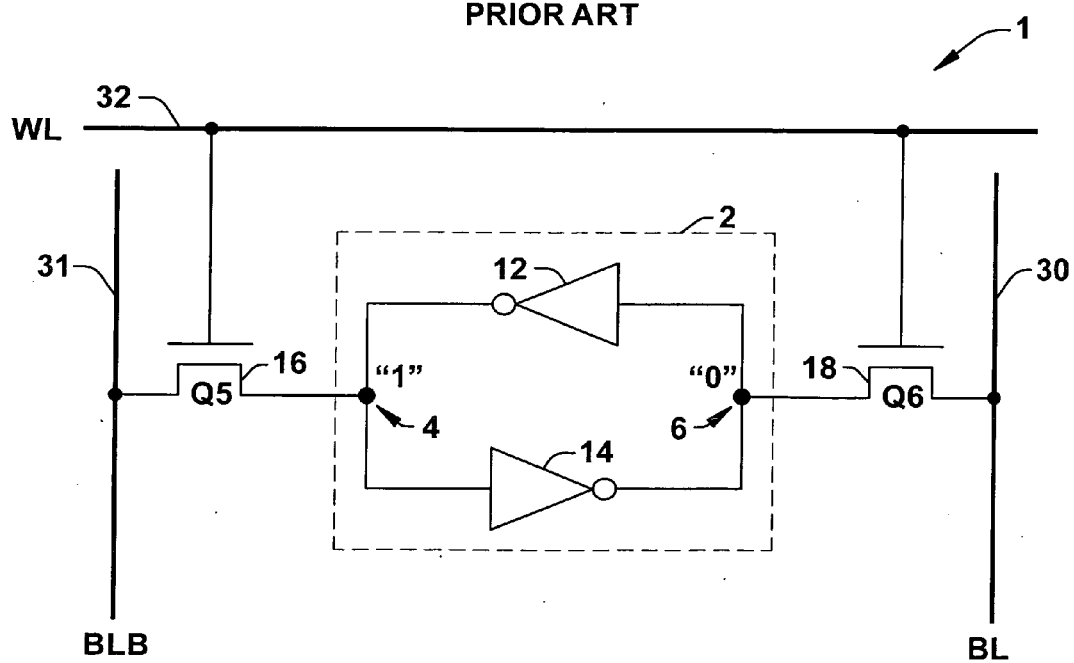
FIG. 1B is a simplified schematic diagram of the conventional 6T static random access memory (SRAM) cell of FIG. 1A, with the core cell represented as a pair of cross-coupled inverters connected to the output data nodes.

Beginning at FIGS. 1A and 1B a conventional 6T SRAM cell 1 is illustrated and several problems arising from read operations are presented.

FIG. 1A, for example, illustrates a schematic diagram for the conventional differential 6T static random access memory (SRAM) cell 1. SRAM cell 1 comprises a data storage cell, latch, or core cell 2, generally including a pair of cross-coupled inverters, for example, inverter 12, and inverter 14, the latch 2 operable to store a data bit state. As illustrated in FIG. 1A, the bit is stored in the latch 2 at the data nodes or first and second latch nodes 4 and 6, respectively, having a high or "1" state and a low or "0" state, respectively. Cell 1 also comprises a pair of wordline pass transistors 16, 18 to read and write the data bit between the cross-coupled inverters 12, 14 and bitlines BL 30, BL-bar 31, when enabled by wordline 32.

Respective inverters 12, 14 comprise a p-type MOS (PMOS) pull-up or load transistor Q1 20, Q2 22 and an n-type (nMOS) pull-down transistor Q3 24, Q4 26. Pass transistors Q5 16, Q6 18 are n-channel as well, which generally supply higher conductance than p-channel transistors. Pass transistors 16, 18 are enabled by wordline 32 and accessed by bitlines 30, 31 to set or reset the SRAM latch 1. FIG. 1A further illustrates that inverters 12, 14 of the SRAM memory cell 1 are connected together to a Vdd drain voltage line 40 and a Vss source voltage line 50.

The differential 6T SRAM cell comprises six transistors and is termed a 6T full CMOS SRAM cell. When the channels of all the transistors are formed in the single crystal silicon substrate, it is called a single crystalline bulk CMOS 6T SRAM cell. It is also referred to as a planar SRAM cell when all the transistors are made in the same substrate material (e.g., bulk crystalline silicon, SOI, etc.).

In general, SRAM cells are more stable and have better data retention where the respective pMOS (20, 22) and nMOS (24, 26) transistors are load balanced and matched for the two inverters (12, 14). However, as dimensions are reduced to scale down devices, random variation increases and it becomes increasingly difficult to achieve a balance in the relative strengths of the pass gate, drive, and load transistors over the desired range of temperature, bias conditions, and process variations in the presence of the range of random variation that occurs over the large number of cells in an array. As a result, SRAM cells formed as such can be adversely affected by varying operating characteristics, may be unstable, and may not retain the desired bit state during read or write operations, or data may not be reliably written into the cells, or there may be insufficient read current.

During the read operation, for example, bitlines 30 and 31 are precharged to a high or "1" state, as shown in FIG. 1A. Wordline WL 32 is selected to activate pass transistors Q5 16 and Q6 18 into conduction. As a high state at latch node 4 is on the gate of Q4 26, and a low state at latch node 6 is on the gate of Q3 24, only Q4 26 on the "low side" conducts a read current 64. Read current Iread 64, conducts from the bitline-bar 31 through Q6 18, latch node 6, and Q4 26 to Vss 50. The read current 64 through Q6 and Q4 briefly creates a voltage drop Vdrop 66 across Q4 26, until the voltage on bitline-bar 31 is discharged to Vss 50 (e.g., ground). If sufficient voltage drop 66 is created by read current 64 to raise latch node 6 to the threshold voltage Vt of Q3 24, then Q3 may begin conducting and the data state of latch 2 may be upset.

Thus the relative relationship between the voltage drop Vdrop 66 across pull-down transistor Q4 26 during a read operation, the static noise margin SNM, and the threshold voltage Vt of the n-channel pull-down transistors (VTnch) Q3 24, and Q4 26 of SRAM memory cell 1 of FIG. 1A. The SNM reflects the statistical data loss due to read upsets. For example, if SNM is too low, some bits of an array of cells will start to fail in a Gaussian distribution. Thus during a read operation, the greater the voltage drop Vdrop 66 across the pull-down transistor, the smaller will be the remaining static noise margin SNM within the available threshold voltage VTnch. Therefore, it is desirable to lower the voltage drop Vdrop 66, or better still to avoid its affect on the latch nodes 4 and 6 in order to maximize the SNM and optimize the switching characteristics of the latch 2.

FIG. 1B illustrates the conventional 6T static random access memory (SRAM) cell 1 of FIG. 1A, with the data storage cell, latch, or core cell 2 represented as a pair of cross-coupled inverters 12 and 14 having the output data nodes 4 and 6, respectively.

Figure 2A:
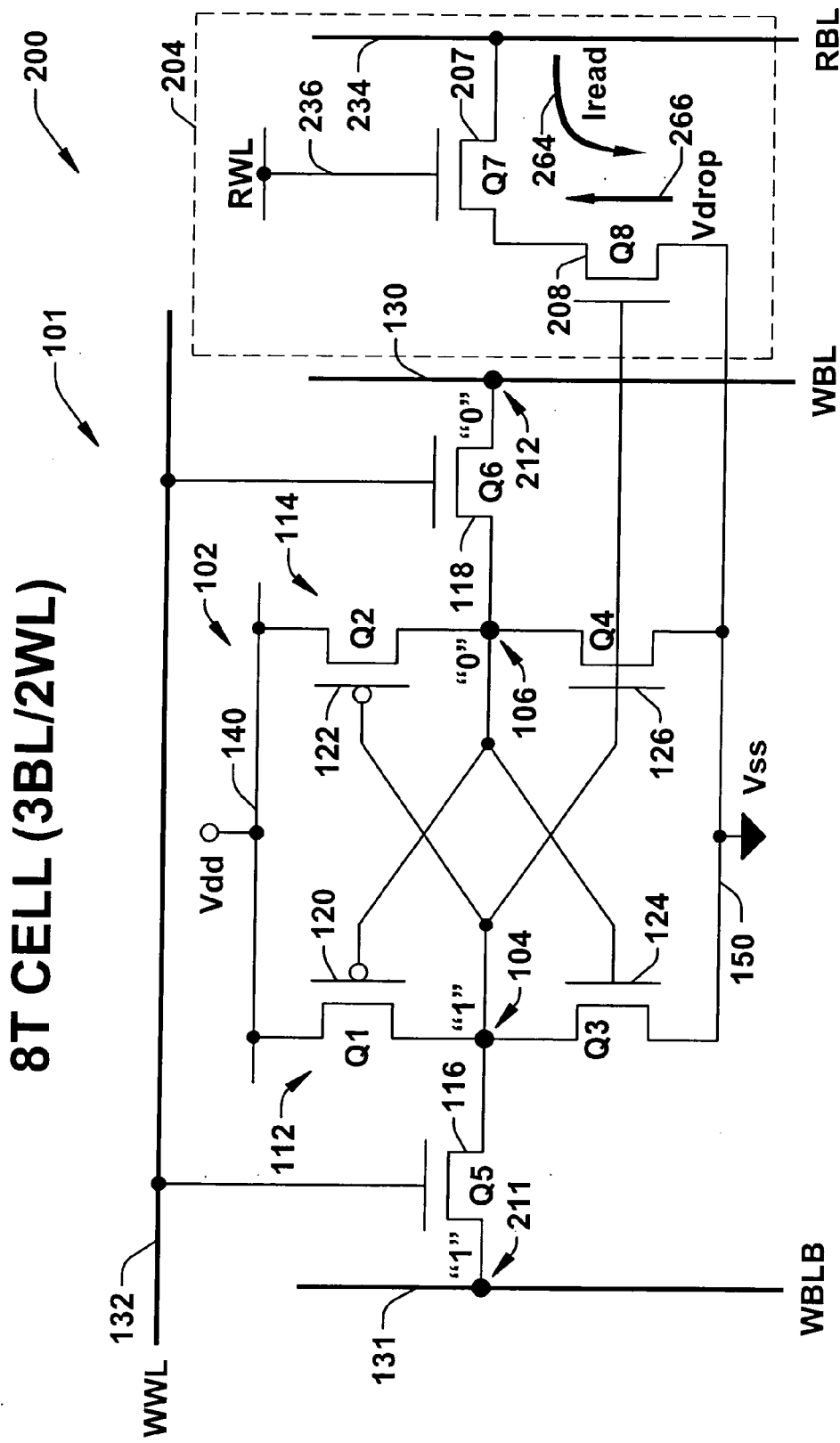
FIG. 2A is a schematic diagram of a single sided 8T SRAM cell having a read buffer to isolate the read current from a data node of the 6T SRAM cell of FIG. 1A during a read operation according to one or more aspects of the present invention.

FIG. 2A illustrates an exemplary eight-transistor (8T) SRAM cell 200 comprising a 6T SRAM cell 101 having a core cell 102, the 8T SRAM cell 200 modified from that of the conventional 6T SRAM cell 1 of FIG. 1A, using a read buffer 204 to remove the read current from latch nodes 104 and 106 of the cell 101 according to one or more aspects of the present invention. The read buffer 204 further comprises a read transistor Q7 207 (acting as a read pass gate) and a read driver transistor Q8 208 series connected between a read bitline RBL 234 and a source voltage Vss 150. The read transistor Q7 207 is gated by a read word line RWL 236 to access the data state of cell 102 by way of the conduction state of Q8 208 to bitline RBL 234. The read driver transistor Q8 208 also has a gate connected to the gate of the n-channel pull-down transistor Q4 126 and the latch node 104. Clearly, in this arrangement, read driver Q8 208 will therefore reflect the conduction of Q4 126, and thus produce a read current that mirrors transistor Q4 126 as described below.

The exemplary 8T SRAM cell 200 of FIG. 2A comprises three bitlines (e.g., write bitline WBL 130, write bitline bar WBLB 131, and read bitline RBL 234) and two wordlines (e.g., write word line WWL 132, and read word line RWL 236) or (3BL/2WL).

During a read operation of cell 200, the read bitline RBL 234 is precharged to a high or "1" state, as shown in FIG. 2A. Read word line RWL 236 is selected to activate read transistor Q7 207 into conduction. For example, with the prior data states as shown in FIG. 2A, an exemplary read current Iread 64, conducts from the read bitline RBL 234 through read transistor Q7 207, and read driver Q8 208 to Vss 150.

Again, the read current Iread 64 through Q7 and Q8 briefly creates a voltage drop Vdrop 66 across Q8 208, until the charge on read bitline RBL 234 is discharged to Vss 150. However, with this configuration of the present invention, the read current Iread 64 beneficially bypasses Q4 126 and the latch node 106, thereby avoiding a voltage drop across Q4 126 and a possible data upset therefrom. Although a voltage drop Vdrop 66 is still produced across Q8 208, this voltage has no path to be coupled back to the latch node 106 of the cell 101 as in the conventional 6T SRAM configuration. Thus, Q7, Q8, and RWL voltage can be optimized for high read current without concern for cell stability, while Q3, Q4, Q5, Q6, and WWL voltage can be optimized for SNM and write without concern for read current. The 8T cell of FIG. 2A illustrates the basic read operation concept of the 8T SRAM cell of the present invention.

FIG. 2A may also be described and represented in another manner, wherein an eight-transistor (8T) SRAM cell 200 comprises an SRAM cell core 102, and circuitry for writing to and reading from the SRAM cell core, according to the principles of the present invention. SRAM cell core 102 is a conventional design using two inverters. A first inverter 112 comprises a first driver transistor 124 and a first load transistor 120. A second inverter 114 comprises a second driver transistor 126 and a second load transistor 122. In this conventional embodiment of SRAM cell core 102, the driver transistors 124 and 126 are n-channel MOSFETs, and the load transistors 120 and 122 are p-channel MOSFETs.

The first inverter 112 has a first output 104 formed by a connection between the drain of the first load transistor 120 and the drain of the first driver transistor 124, and a first input 106 formed by a connection between the gate of the first driver transistor 124 and the gate of the first load transistor 120. Similarly, the second inverter 114 has a second output 106 formed by a connection between the drain of the second load transistor 122 and the drain of the second driver transistor 126, and a second input (or the first output) 104 formed by a connection between the gate of the second load transistor 122 and the gate of the second driver transistor 126. In a conventional manner, the first and second inverters 112, 114 are cross-coupled, meaning that the output of each inverter is connected to the input of the other, to form an SRAM cell core that stores a single bit of information.

Also in a conventional manner, a write transistor 118 is connected to the first output 104. Similarly, a complementary write transistor 116 is connected to the second output 106. The gates of write transistor 118 and complementary write transistor 116 are each connected to a write wordline (WWL) 132. Together, the write transistor 118 and the complementary write transistor 116 form a write circuit that is used to impose a state on the SRAM cell 200 in cooperation with the WWL 132, a write bit-line (WBL) 130 and a complementary write bit-line (WBLB) 131. For example, if the WBL 130 is set to a value of Vdd 140 while the WBLB 131 is set to value of Vss 150, then, when the WWL 132 is asserted (set to Vdd), the output of the first inverter 112 will be set to a value of Vdd plus the drain-source voltage of load transistor 120, while the output of the second inverter 114 will be set to Vss plus the drain-source voltage of driver transistor 126. This state may be interpreted as a logical "one" for the SRAM cell core 102. It is immediately apparent that repeating this operation with the WBL 130 set to Vss and the WBLB 131 set to Vdd would result in setting the SRAM core cell 102 to a logical "zero."

In one embodiment of the invention, a state of the SRAM cell core 102 can be determined by using a read circuit 204 including a read transistor 207 and a read driver transistor 208. In the embodiment shown in FIG. 1, the gate of the read driver transistor 208 is connected to the first output 104 of the first inverter 112. A source of the read transistor 207 is connected to a drain of the read driver transistor 208, and a drain of the read transistor 207 is connected to a read bitline (RBL) 234. The gate of the read transistor 207 is connected to the read word line (RWL) 236, while the gate of the write transistors 116 and 118 are connected to the write word line (WWL) 132, thus the write transistors 116,118 and the read transistor 207 are controlled by separate word line selection signals. The use of individual word lines for the READ and WRITE operations permits customized READ and WRITE operation voltages that avoids a trade-off between a fast (higher voltage, higher current) read access and a stable write (lower voltage write) that avoids data upsets in a memory device comprising SRAM cell 200, while permitting a compact cell layout.

When the SRAM cell core 102 is storing a logical zero, the output of the second inverter 114 is high, thereby turning on the read driver transistor 208, and forming a low resistance path from the drain of the read driver transistor 208 to Vss 150. The state of the SRAM cell 200 may be determined by precharging the state of the RBL 234 to approximately Vdd and asserting the RWL 236. Alternatively, the RBL 234 may be precharged to a voltage lower than Vdd to reduce power consumed by the READ. Because the read driver transistor 208 is on, when the read transistor 207 is turned on by asserting the RWL 236, the RBL 234 is pulled below its precharge voltage. However, if the SRAM cell 200 is set to a logical one, then the output of the second inverter is a logical zero, and the read driver transistor 208 will be off. When the RWL 236 is asserted, the read transistor 207 is turned on, but the RBL 234 remains at the precharge voltage, or logical one.

Those skilled in the art of SRAM cell design will appreciate that the electrical characteristics of the inverter transistors and write transistors are balanced to optimize the stability of the SRAM cell 200. If both read and write functions were provided by the write transistor 118 and the complementary write transistor 116, the time required for a read operation would be constrained by the maximum drive current (IDsat), and turn-on time of the write transistor 118 and the complementary write transistor 116. However, the present invention advantageously allows the maximum drive current or threshold voltage of the read transistor 207 to be designed substantially independently of the constraints on SRAM cell stability. Thus, the read transistor 207 can be designed with different electrical characteristics than the write transistor 118 or either of the driver transistors 124,126 of the core cell 102.

In one embodiment, the read transistor 207 is designed to have a larger IDsat than the write transistor 118, or alternately of any of the other transistors of the core cell 102. In an alternate embodiment, the read transistor 207 is designed to turn on faster than does the write transistor 118. In yet another embodiment, the threshold voltage of read transistor 207 is designed to be lower than the threshold voltage of write transistor 118, or alternately of any of the other transistors of the core cell 102. One skilled in the art will appreciate that these embodiments can be combined as desired to result in the desired SRAM performance.

Those skilled in the pertinent art will also appreciate that in another alternate embodiment, the read circuitry could be designed using complementary transistor polarity. For example, the read transistor 207 could be a p-channel transistor. In this embodiment, the drain of the read transistor 207 is connected to the drain of the read driver transistor 208, and the source of the read transistor 207 is connected to the RBL 234. The RWL 236 is then asserted as a logical zero, thereby turning on read transistor 207 during a READ. In another embodiment, read driver transistor 208 is also implemented as a p-channel transistor, with its source connected to Vdd 140. In this embodiment, the RBL 234 is precharged low, and pulled up to a logical one when a low voltage at the second inverter output 140 turns on the read driver transistor 208 (thereby making the read driver transistor 208 a pull-up transistor).

Figure 2B:
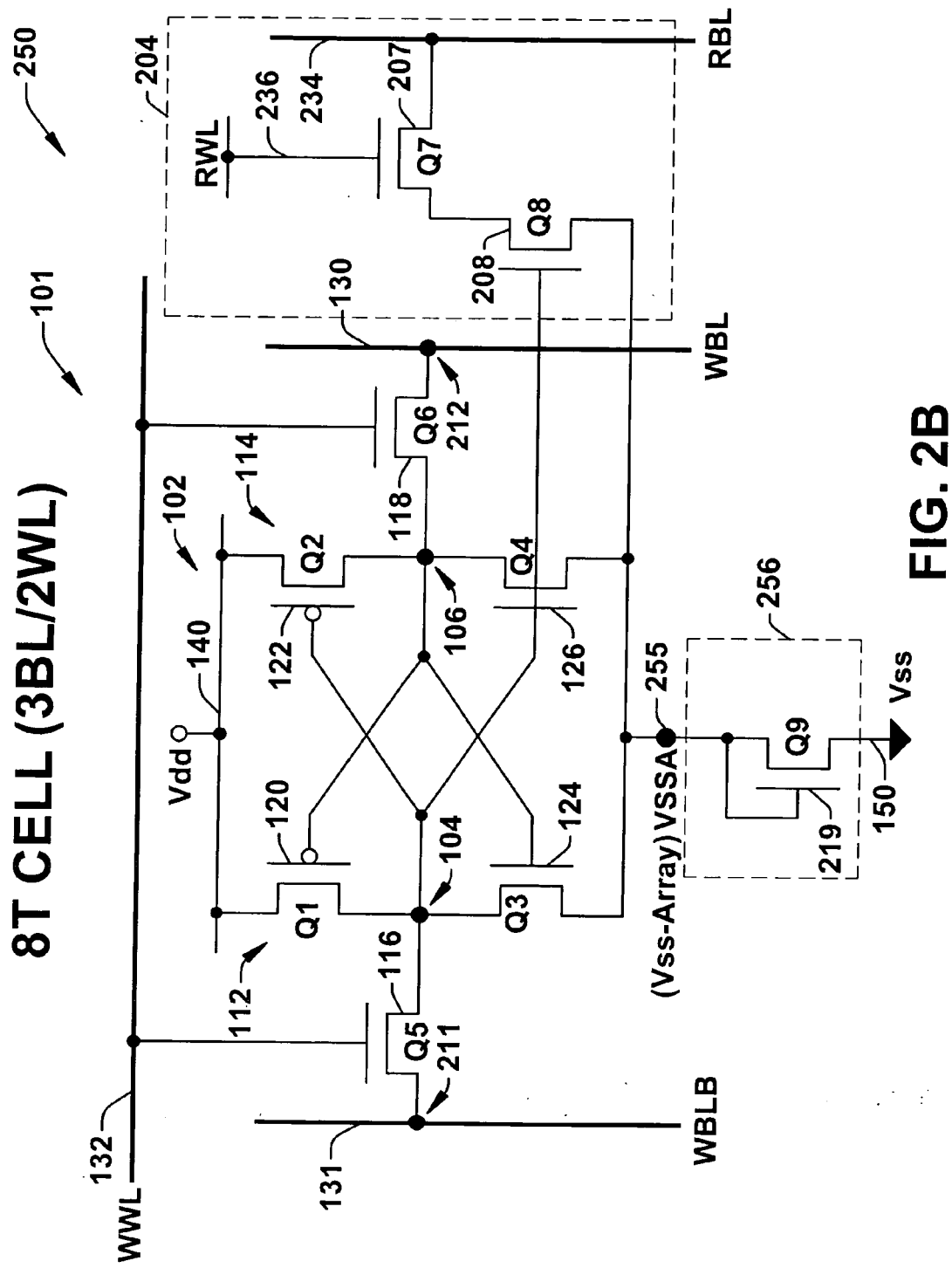
FIG. 2B is a schematic diagram of a single sided 9T SRAM cell similar to that of FIG. 2A, further comprising a Vss clamp diode connected between a source terminal of the core cell and a source voltage (Vss), whereby the array Vss is raised to avoid degrading a lower WWL voltage during write operations, while the RWL voltage is boosted during read operations to compensate for the impact of raised Vss on the read current according to one or more aspects of the present invention.

FIG. 2B illustrates an exemplary single sided 9T SRAM cell 250 similar to that of FIG. 2A according to one or more aspects of the present invention. Cell 250 comprises a further modification of the 8T SRAM cell of FIG. 2A, and therefore need not be completely described again for the sake of brevity. 8T SRAM cell 250 comprises a latch 102 that uses the read buffer having read driver transistor Q8 208 and read transistor Q7 207 to remove the read current (e.g., Iread 264) from the first or second data nodes 104 and 106, respectively, during a read operation. Cell 250 further adds a transistor Q9 219 connected as a diode between a source terminal (e.g., Vss-Array 255) of the core or data cell 102 and a source voltage Vss 150. Transistor Q9 219 may be shared among the many 8T cells 250 in an SRAM array, such as array 290 of FIG. 2E that will be discussed further infra. More generally, a VSSA voltage is supplied to the array, where VSSA is >Vss of the periphery, or, more particularly, greater than the Vss of the write BL driver. In this embodiment of the present invention, the array-Vss 255 may be raised in conjunction with a relatively low write word line voltage 132 to enable a WRITE without upset of the cells in unaddressed columns. This is one embodiment of a write assist that enables the cell to be written with a WL voltage that is below a level that would cause an upset of cells in unaddressed columns of the addressed row. Those familiar with the art of memory design will realize there are other write assist circuits, such as use of capacitive coupling to drive a write bit line negative relative to VSSA, or selectively lowering VDD to the addressed columns. For read operations, the read wordline may be high relative to the write WL voltage to compensate for the impact of a raised Vss (e.g., Vss-Array 255) on the read current (e.g., Iread 264).

For example, the Vss is raised to VSSA by a Vss supply circuit 256, such as by Q9 219 used as a clamp diode. Alternately, a Vss supply circuit 256, such as transistor Q9 219 may be included in every SRAM memory cell 250 of the array as is illustrated in array 280 of FIG. 2D.

The exemplary 8T SRAM cell 250 embodiment of FIG. 2B comprises three bitlines (e.g., write bitline WBL 130, write bitline bar WBLB 131, and read bitline RBL 234) and two wordlines (e.g., write word line WWL 132, and read word line RWL 236) or (3BL/2WL).

Figure 2C:
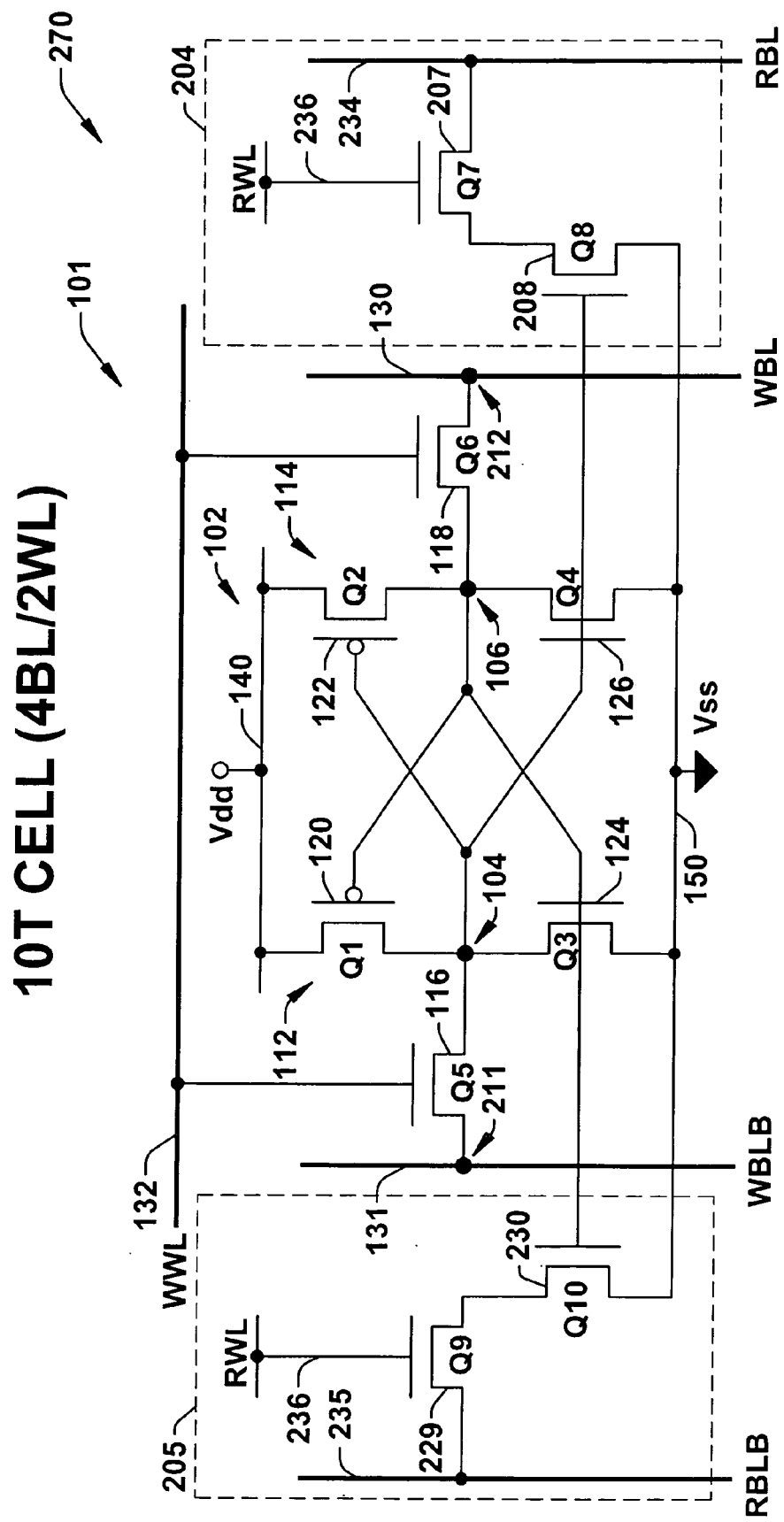
FIG. 2C is a schematic diagram of a differential 10T SRAM cell, similar to the SRAM cell of FIG. 2A, having a complementary pair of read buffers to isolate the read current from the data nodes of the 6T SRAM cell of FIG. 1A during a read operation according to one or more aspects of the present invention.

FIG. 2C is a schematic diagram of a differential 10T SRAM cell, similar to the SRAM cell of FIG. 2A, having a complementary pair of read buffers (e.g., first read buffer 204 and second read buffer 205), to isolate the read current from both the data nodes of the 6T SRAM cell 101 of FIG. 2A during a read operation according to one or more aspects of the present invention.

10T SRAM cell 270 comprises a further modification of the 8T SRAM cell of FIG. 2A and therefore need not be completely described again for the sake of brevity. 10T SRAM cell 270 comprises a read buffer on each side of a latch 102, each read buffer 204, 205 having read driver transistor Q8 208 and read transistor Q7 207 to remove the read current (e.g., Iread 264) from the first and second data nodes 104 and 106, respectively, during a read operation. The exemplary 10T SRAM cell 270 embodiment of FIG. 2C comprises four bitlines (e.g., write bitline WBL 130, write bitline bar WBLB 131, read bitline RBL 234, and complementary read bitline bar RBLB 235) and two wordlines (e.g., write word line WWL 132, and read word line RWL 236) or (4BL/2WL).

Cell 270 comprises read transistors Q7 207 and Q9 229, respectively to select a row of cells during a read operation. Initially, columns of cells may be activated by selecting and precharging read bitlines RBL 234 and RBLB 235 (e.g., asserting a bitline selection signal or voltage) associated with cell 270, either before or during a read or write operation, such that the cell 270 is selected and activated. Thereafter, the rows are selected during a read operation by asserting read wordline RWL 236 to the gates of read transistors Q7 207 and Q9 229, respectively, to couple first and second latch nodes 104 and 106 to RBL 234 and RBLB 235, respectively.

During the read operation, read bitlines RBL 234 and RBLB 235 of cell 270, are precharged to a high or "1" state. Read wordline RWL 236 is selected (e.g. by asserting a read signal or voltage) to activate read transistors Q7 207 and Q9 229 into conduction, and the write word line WWL 132 is deselected, turning off Q5 116 and Q6 118. For example, with the prior data states shown in FIG. 2A, an exemplary read current Iread 264 conducts from the RBL 234 through read transistor Q7 207, and read driver Q8 208 to Vss 150. For improved conduction to the latch 102, the read signals to read transistors Q7 207 and Q9 229, may be boosted above the Vdd supply voltage level, as will be discussed further in connection with FIGS. 3A-C infra.

Again, a read current Iread 264 through Q7 and Q8 briefly creates a voltage drop Vdrop 266 across Q8 208, until the charge on RBL 234 is discharged to Vss 150. However, with this configuration as with that of FIG. 2A, the read current Iread 264 beneficially bypasses pull-down transistors Q3 124 or Q4 126 and the latch nodes 104 or 106, respectively, thereby avoiding a voltage drop across Q3 124 or Q4 126 and a possible data upset therefrom. The voltage drop Vdrop 266 is still produced across Q8 208, however, this voltage is not coupled to the latch node 106 of the cell as a read from BL 30 was in the conventional 6T SRAM configuration of FIG. 1A. Thus, the 10T cell of FIG. 2C illustrates that the read current Iread 264 is isolated from the latch nodes 104 and 106 of the cell of the present invention.

During a write operation, write wordline 132 is selected (e.g., by asserting a write signal or voltage to the wordline) to the gates of write (pass) transistors Q5 116 and Q6 118. In this way, the latch nodes 104 and 106 are conductively coupled to the write bitlines WBL 130 and WBLB 131, respectively, during a write operation. To avoid data upsets to the latch 102, the write signal on WWL 132 to write transistors Q5 116 and Q6 118, may be dropped below the Vdd supply voltage level, as will be discussed further in connection with FIGS. 3A-C infra.

Figure 2D:
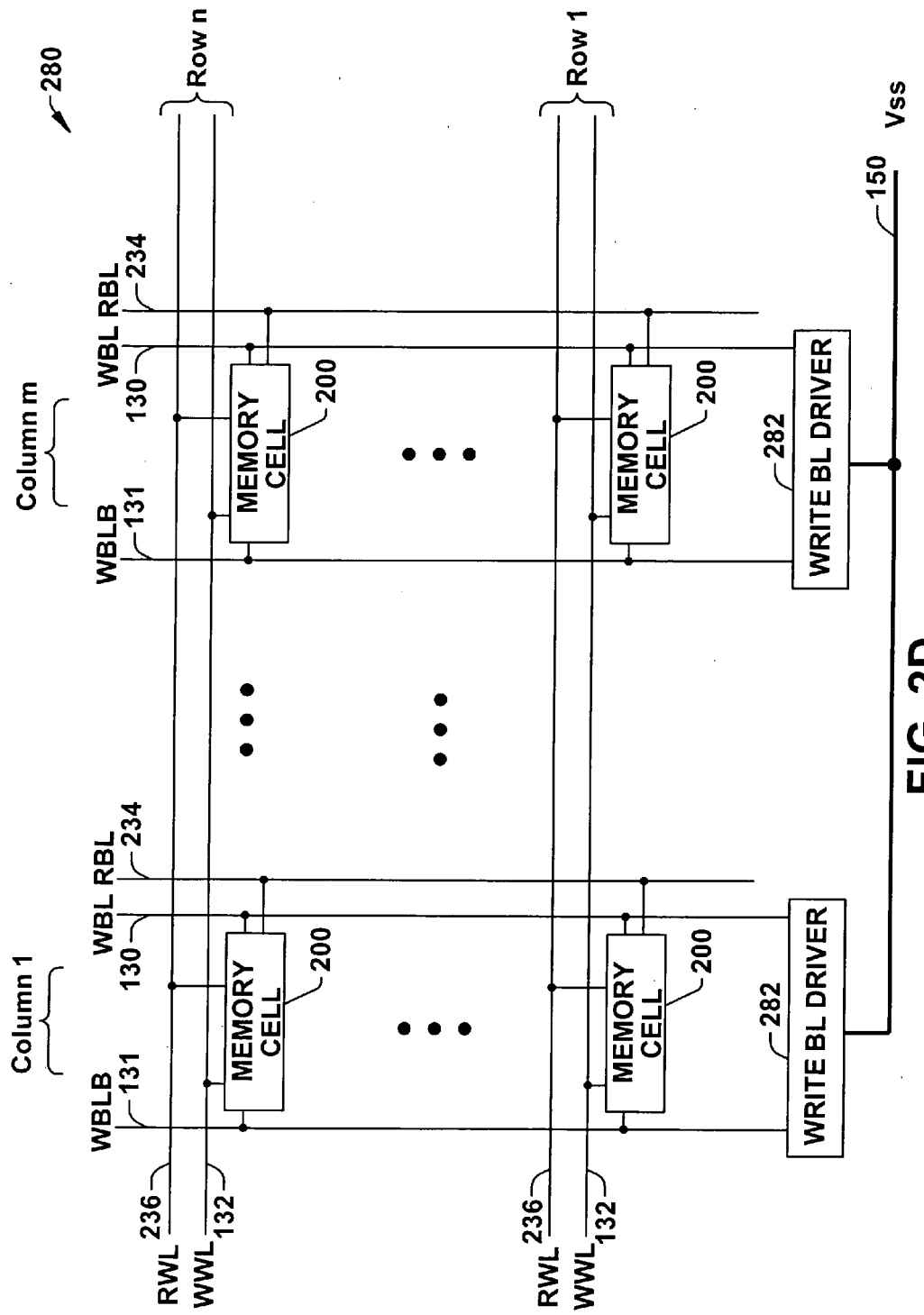
FIG. 2D is a schematic diagram of an exemplary array of memory cells, similar to the SRAM memory cell of FIG. 2A, the array having columns of read and write bitlines and rows of read and write wordlines according to one or more aspects of the present invention.

FIG. 2D illustrates an exemplary array 280 of SRAM memory cells 200, similar to the SRAM memory cell 200 of FIG. 2A according to one or more aspects of the present invention. The memory cells 200 of array 280 are arranged in rows (e.g., Row 1, ... Row n) and columns (e.g., Column 1, ... Column m) of cells 200. In addition, array 280 has columns (e.g., Column 1, ... Column m) of read and write bitlines, for example, WBL 130, WBLB 131, and RBL 234, respectively, and rows of read and write wordlines (e.g., Row 1, ... Row n), for example, WWL 132 and RWL 236, respectively. The write bitlines WBL130 and WBLB 131, are driven with complimentary states by a write bitline driver 282 during memory write operations. Thus, it may be observed from FIGS. 2A and 2D that the gate of the read transistor Q7 207 is connected to a read word line RWL 236 associated with a row of cells 200 (e.g., Row 1, ... Row n), wherein the read word line RWL 236 is operable to control access to the cells 200 in the row during a read operation, and wherein a drain of the read transistor Q7 207 is connected to a read bit line RBL 234 associated with a column of cells 200 (e.g., Column 1, ... Column m), wherein the read word line RBL 234 is operable to control access to the cells 200 in the row during a read operation.

Figure 2E:
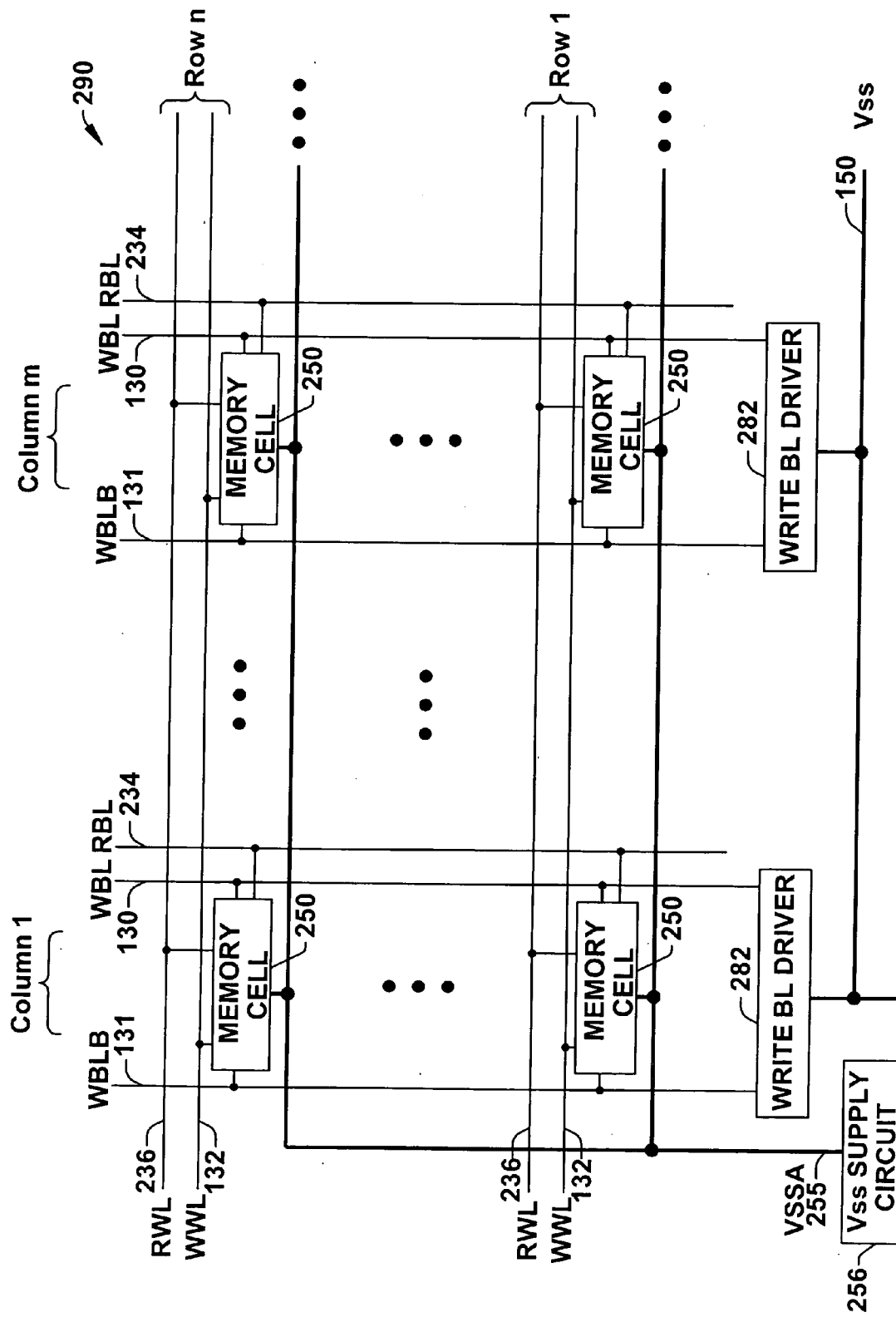
FIG. 2E is a schematic diagram of an exemplary array of memory cells, similar to the SRAM memory cell of FIG. 2B, the array having columns of read and write bitlines, rows of read and write wordlines, and a Vss supply circuit according to one or more aspects of the present invention.

FIG. 2E illustrates an exemplary array 290 of SRAM memory cells 250, similar to the SRAM memory cell 250 of FIG. 2B according to one or more aspects of the present invention. The array 290 of FIG. 2E is similar to the array 280 of FIG. 2d, and as such need not be described again fully for the sake of brevity. The memory cells 250 of array 290 are arranged in rows (e.g., Row 1, ... Row n) and columns (e.g., Column 1, ... Column m) of cells 250. In addition, array 280 has columns (e.g., Column 1, ... Column m) of read and write bitlines, for example, WBL 130, WBLB 131, and RBL 234, respectively, and rows of read and write wordlines (e.g., Row 1, ... Row n), for example, WWL 132 and RWL 236, respectively. The write bitlines WBL130 and WBLB 131, are driven with complimentary states by a write bitline driver 282 during memory write operations.

Array 290 further comprises a Vss supply circuit 256, such as the clamp diode Q9 219 of FIG. 2B, for example. When a single Vss supply circuit 256 (e.g., a write assist circuit) is utilized for the entire array, the VSSA 255 connection from each of the cells 250 may be connected to the single or common Vss supply circuit 256. Alternately, a VSS supply circuit may be provided for each column or for each row. Alternately, and as discussed previously, it will be appreciated in the context of the present invention, that a Vss supply circuit 256 or transistor Q9 219 may be included within each memory cell. For example, FIG. 2E illustrates an exemplary circuit when one Vss supply circuit 256 is used for the whole array, however, if the Vss supply circuit 256 is included within each 8T cell to form a 9T cell, for example, then the Vss supply circuit 256 of FIG. 2E would not be needed, and the line labeled VSSA 255 in the schematic would directly connect to Vss 150.

The circuit of array 290 provides conditions where VSS-array (VSSA 255) is >Vss as the write BL driver 282 provides a voltage closer to Vss than that of the Vss supply circuit 256, and wherein Vss is applied to the write BL driver circuitry 282 driving the write bitlines WBL130 and WBLB 131. Thus, in the embodiment of the present invention, the array-Vss 255 may be raised in conjunction with a relatively low write word line voltage 132 to enable a WRITE without upset of cells in unaddressed columns.

Figure 3A:
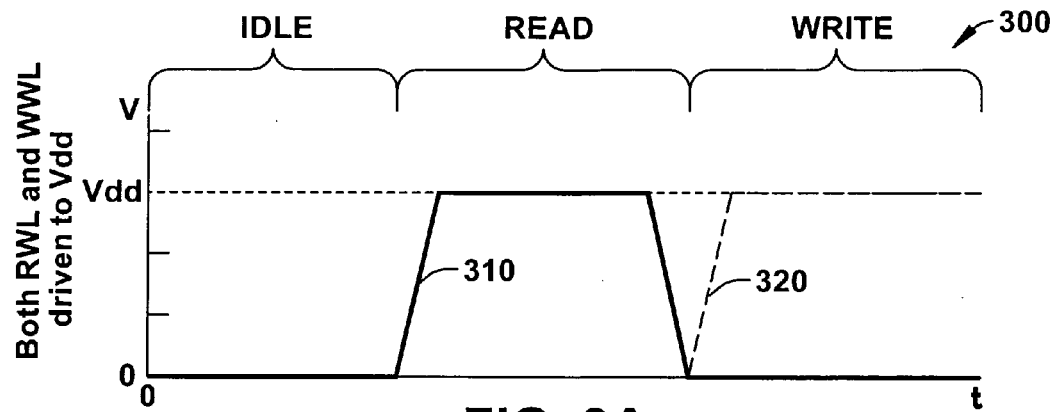
FIGS. 3A, 3B, and 3C are simplified plots of several exemplary read wordline RWL and write wordline WWL voltages which may be used in the SRAM memory cells of FIGS. 2A and 2C during idle, read, and write operations according to one or more aspects of the present invention.
Figure 3B:
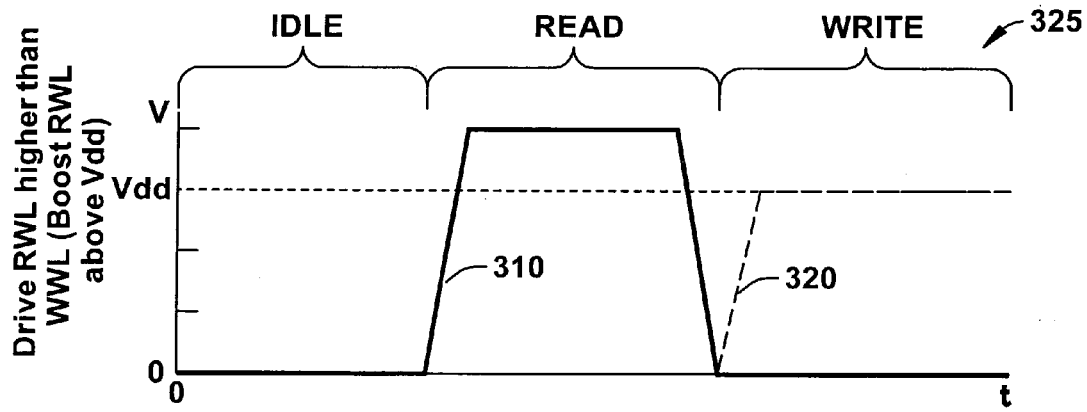
Figure 3C:
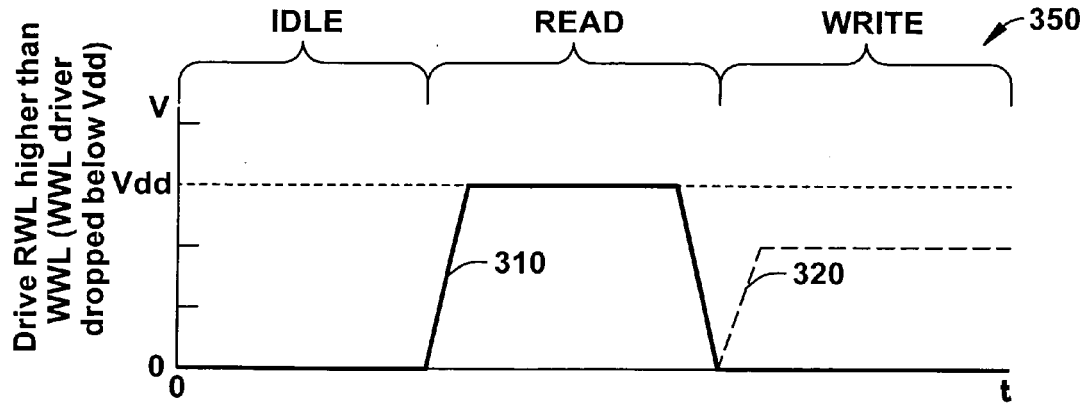

FIGS. 3A, 3B, and 3C illustrate several exemplary plot combinations of read wordline RWL 310 and write wordline WWL 320 voltages, which may be used in the SRAM memory cells of FIGS. 2A and 2C, for example, during idle, read, and write operations according to one or more aspects of the present invention. Plots 300, 325, and 350 illustrate the applied wordline voltage "V" on the vertical (X) axis, and time "t" on the horizontal (Y) axis.

Because the SRAM cells of the present invention (e.g., FIGS. 2A and 2C) have independent wordlines, for example, read word lines RWL 236 and write wordline WWL 132, these wordlines may have different voltages. Plot 300 of FIG. 3A, for example, illustrates idle, read, and write operations having the same read wordline voltage RWL 310 during a read operation as the write wordline WWL 320 voltage during a write operation. In the example of FIG. 3A, RWL 310 and WWL 320 are both driven to Vdd during their respective operations.

Plot 325 of FIG. 3B illustrates idle, read, and write operations having a different read wordline voltage RWL 310 during a read operation as compared to the write wordline WWL 320 voltage during a write operation. In this example, RWL 310 is boosted above Vdd during a read operation and WWL 320 is driven only to Vdd during the write operation. Thus, boosting the read signals above the Vdd supply voltage level to read transistors (e.g., Q7 207 and Q9 229) during read operations, will improve conduction to the latch 102.

Plot 350 of FIG. 3C also illustrates idle, read, and write operations having a different read wordline voltage RWL 310 during a read operation as compared to the write wordline WWL 320 voltage during a write operation. In this example, RWL 310 is driven only to Vdd during a read operation and WWL 320 is dropped down below Vdd during the write operation. Thus, the write signal WWL 320 to write transistors (e.g., Q5 116 and Q6 118) may be dropped below the Vdd supply voltage level during write operations to avoid data upsets to the latch 102.

Figure 8:
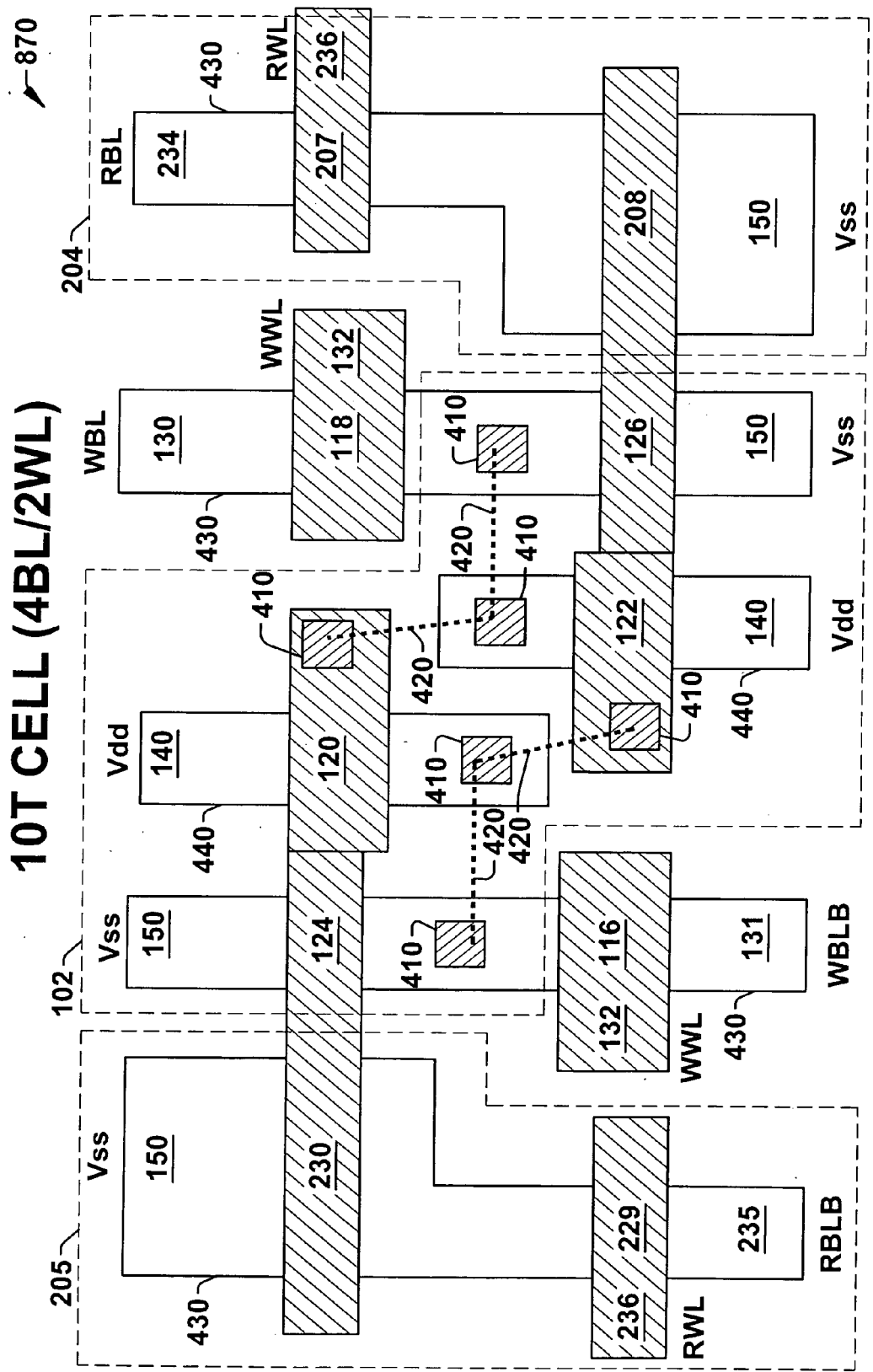
FIG. 8 is a plan view of an exemplary physical layout of transistors in an 10T SRAM cell such as that of FIG. 2C having 4 bitlines (BL) and 2 wordlines (WL), designed in accordance with the principles of the present invention.

FIGS. 4-7 illustrate several exemplary physical layouts 400, 402, 404, 406, respectively, of transistors in an 8T SRAM cell such as that of FIG. 2A having 3 bitlines (BL) and 2 wordlines (WL) providing a single-ended read configuration, designed in accordance with the principles of the present invention. FIG. 8 illustrates an exemplary physical layout 870, of transistors in a 10T SRAM cell such as that of FIG. 2C having 4 bitlines (BL) and 2 wordlines (WL) providing a differential read configuration, designed in accordance with the principles of the present invention. Layouts 400, 402, 404, 406, and 870, for example, illustrate a read buffer 204 gated by an output of a latch (e.g., latch 102), where the output of the latch is coupled to the read buffer 204 by an extension of the gate of the second driver 126.

Figure 4:
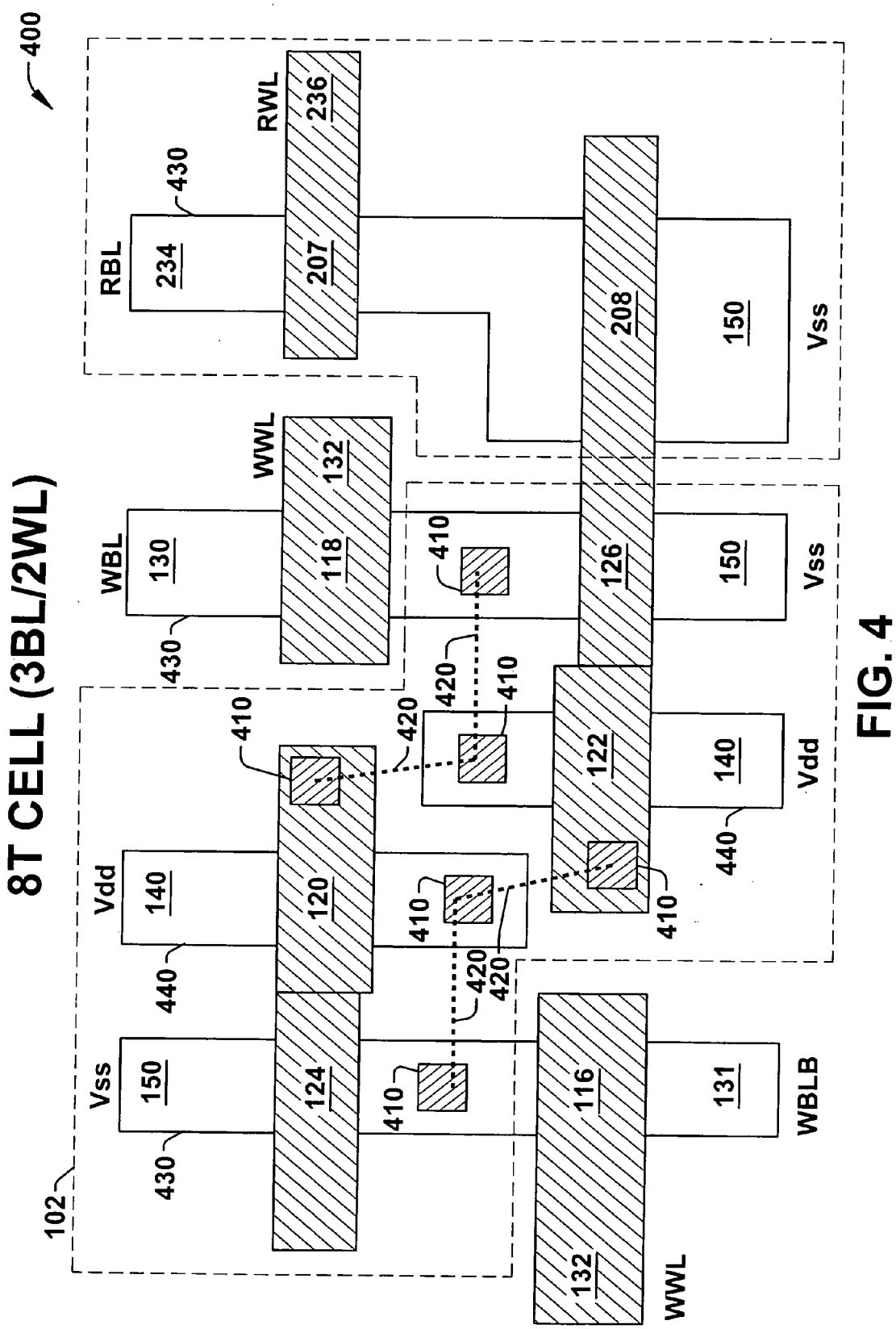
FIGS. 4-7 are plan views of exemplary physical layouts of transistors in an 8T SRAM cell such as that of FIG. 2A having 3 bitlines (BL) and 2 wordlines (WL), designed in accordance with the principles of the present invention.
Figure 5:
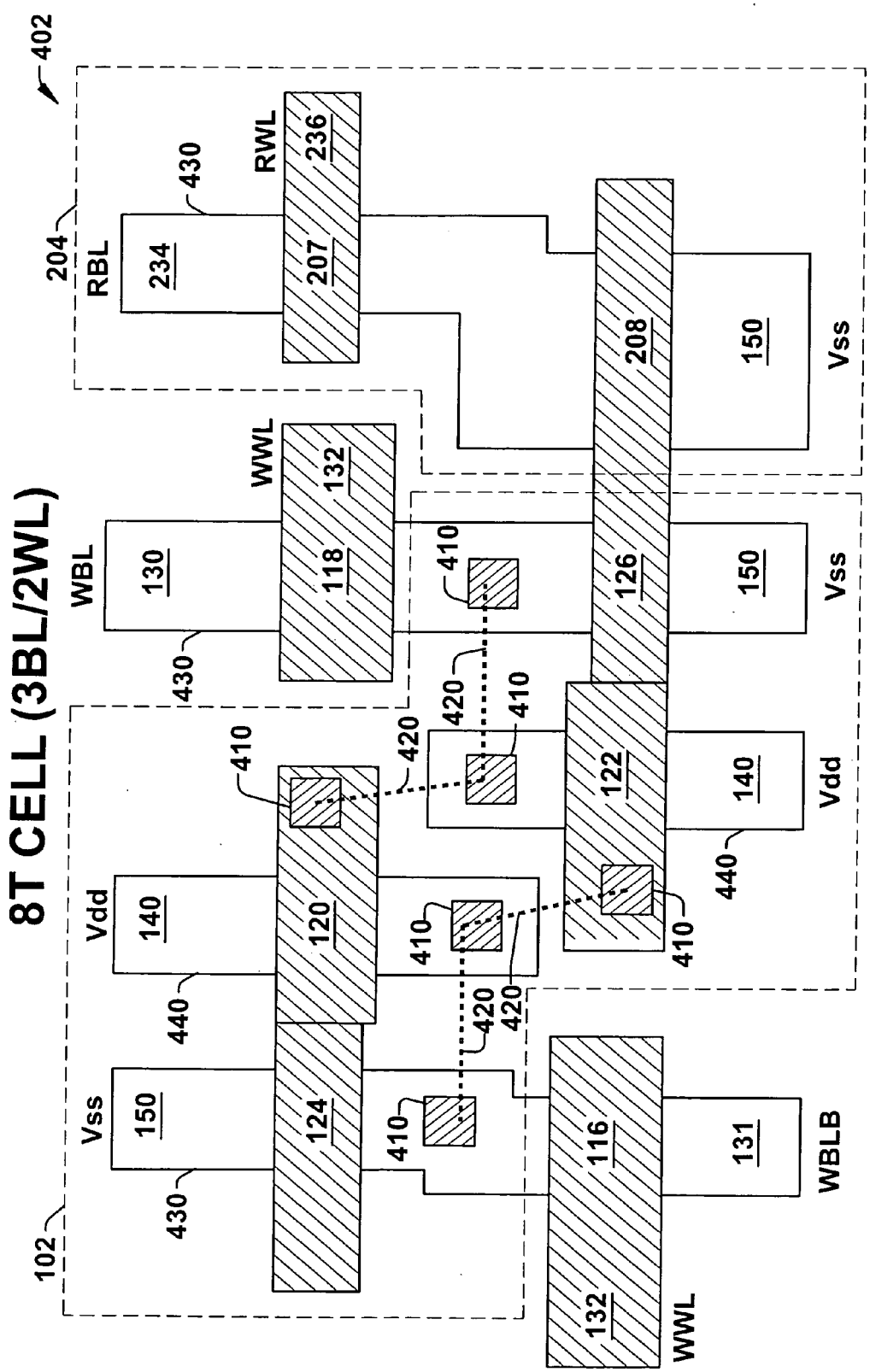
Figure 6:
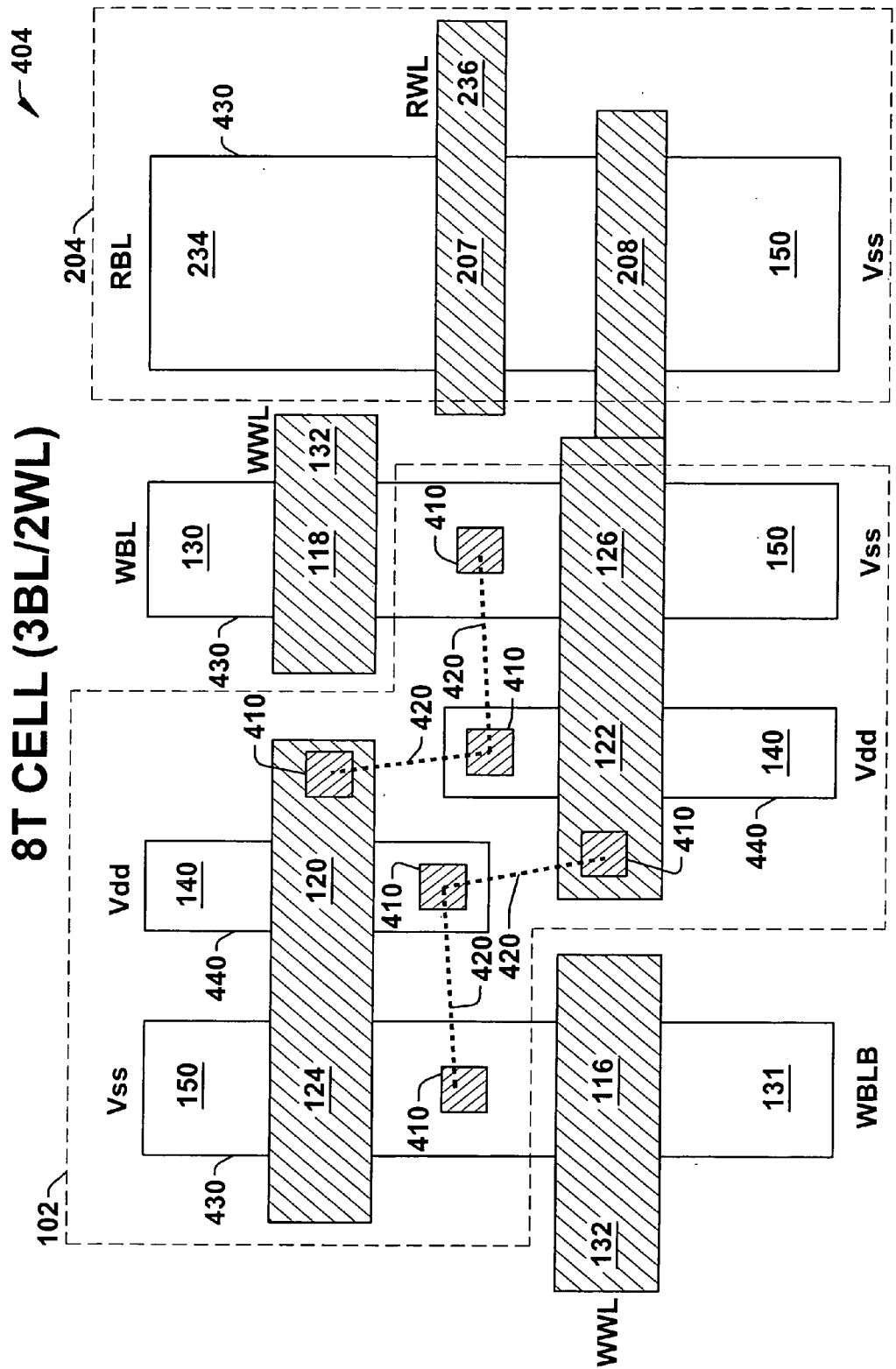
Figure 7:
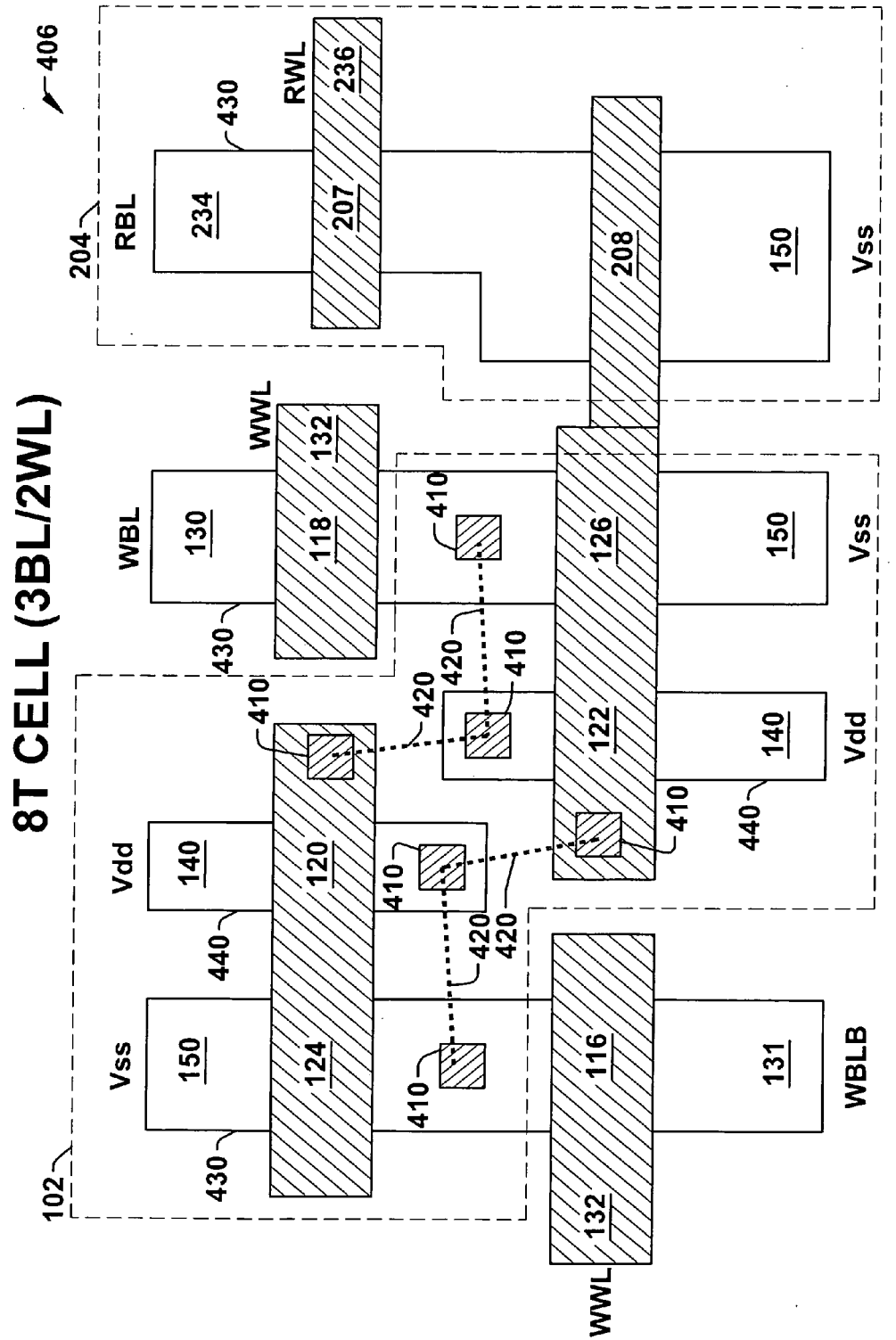

Turning now to FIG. 4, for example, an exemplary physical layout 400 on a semiconductor substrate is shown of the SRAM cell 200 with read buffering and write circuitry shown in FIG. 2A. For clarity, only the active and gate structures and a schematic indication of the interconnection of the inverters are shown. The layout of the bit-lines, word lines and power supply lines can follow standard design familiar to those skilled in the art of SRAM design. The SRAM core cell 102 comprises a first driver transistor 124 and a first load transistor 120, and a second driver transistor 126 and a second load transistor 122, as well as contacts 410 and interconnects 420.

The first driver transistor 124 and a complimentary write transistor 116 share an n-type active region 430, as do the second driver transistor 126 and a write transistor 118. Additionally, a read transistor 207 and a read drive transistor 208 share another n-type active region 430. The first and second load transistors 120 and 122, respectively, are formed within independent p-type active regions 440. A p-type active region 440 may be common with a p-type active region in an adjacent cell, not shown for clarity, as would be understood by those familiar with the art. The gates of the second driver transistor 126, the second load transistor 122 and the read drive transistor 208 have a common gate structure, meaning they are coupled using a single strip of gate material, (e.g., polysilicon). Similarly, the gates of the first driver transistor 124 and the first load transistor 120 have a common gate structure. The gate lengths (Y-axis in the Figures) of the gates of the read transistor 207 and the read driver transistor 208 are shown to be different as is shown in the layouts of FIGS. 4, 5, 7, and 8 of other embodiments of the present invention, although those skilled in the art will recognize that these gate lengths could be designed to be the same and remain in the spirit of the present invention.

Alternately, the read transistor gate length may be made longer than some minimum to reduce leakage to the read bit line, and to have the read driver gate length minimized in order to maximize read current. In addition, it is advantageous to have the gate lengths in the core cell to be longer than a minimum length and to have the gate length of the read driver transistor at a minimum gate length. The longer gate length generally reduces variation and reduces leakage to the core cell while the shorter gate length increases read current. Reducing variation and reducing leakage are desirable for the core cell while increased current drive is generally unimportant in the core cell. The opposite is the case for the read driver transistor. The gate width of the read driver transistor 208 is also shown in the embodiments of FIGS. 4, 5, 7, and 8 as greater than the gate width of the write transistors 116 and 118, or the second driver transistor 126 of the core cell 102 sharing the same gate poly. Since the drive current of a transistor is proportional to the channel width divided by the gate length, expressed as $$Idrive \propto W/L,$$

the read driver transistor 208 has a larger maximum drive current than does the read transistor 207, the write transistors 116 and 118, or the first and second driver transistors 120 and 126. In this manner, read driver transistor 207 has a larger maximum drive current than does the driver transistor 126, and a faster read operation is provided than would be the case if the driver transistor 126 were used as a read driver transistor. In addition, the gate length (Y-axis in the Figures) of the read transistor 207 (or read driver transistor 208) is drawn shorter than the gate length of the write transistor 118, providing a greater read current for the read transistor 207 than would be provided with the write transistor 118. Alternatively, or in combination with the lower gate length, the threshold voltage of the read transistor 207 (and/or read driver transistor 208) may be designed to be lower than that of the write transistor 118 and driver transistor 126 to result in a faster turn-on of the read transistor 207 as well as higher read current. Those skilled in the art of SRAM design will recognize that these design options may be combined as desired to meet the design constraints of the circuit.

Since the read transistor 207 of the present invention advantageously has a separate read wordline RWL 236, the read wordline voltage (e.g., RWL 310) may be boosted above the level of Vdd 140, for example, to provide a greater Idrive of the read transistor 207 than would be otherwise possible alone with write transistor 118, such as is only used in the prior art during read operations and driven by a lower conventional wordline voltage as limited by the stability of the cell. Thus, read transistor 207 may have a correspondingly narrower gate width as is illustrated in FIGS. 4, 5, 7, and 8, while still providing the greater Idrive and faster turn-on.

In the embodiment of FIG. 4, the gate lengths of the transistors making up the cross-coupled inverters (e.g., the driver transistors 124, 126, and the load transistors 120, 122), and the WRITE transistors 116 and 118 are advantageously drawn longer than the minimum gate length available in the semiconductor technology being used, to reduce variability either from process variation or from any random variation in channel doping. Such variation in the transistors of the cross-coupled inverters and the WRITE transistors can significantly increase the likelihood of upsetting the state of the SRAM core cell when the cell is accessed. Analogous variation in the read transistor 207 and read driver transistor 208 does not have such a serious degrading effect, as the read current (e.g., Iread 266) is isolated from the latch nodes 104 and 106 of the core cell 102. Thus, transistors 207 and 208 can advantageously be designed with minimum gate length.

The exemplary physical layout 870, of FIG. 8 further illustrates a differential read configuration in a 10T SRAM cell, designed in accordance with the principles of the present invention, the cell comprising a complementary pair of read buffers 204 and 205. Layout 870, for example, illustrates read buffer 204 gated by an output of a latch (e.g., 102), where the output of the latch is coupled to the read buffer 205 by an extension of the gate of the second driver 126, and complementary read buffer 205 gated by an output of the latch (e.g., 102), where the output of the latch is coupled to the read buffer 205 by an extension of the gate of the first driver 124. Other elements of layout 870 are similar to those of FIGS. 4-7 and need not be fully described again for the sake of brevity.

Thus, FIGS. 4-8 represent a few of the possible layout embodiments of the present invention, wherein the maximum drive current Idrive is increased to provide a faster read access time, or the threshold voltage of the read transistor 207 (and/or read driver transistor 208) may be designed to be lower than that of the write transistors 116 and 118 to result in a faster turn-on of the read buffer transistors 207 and 208. In accordance with the layouts illustrated and the spirit of the present invention, the increased drive current Idrive, may be accomplished using any combination of a shorter gate length, and/or a greater gate width of the read buffer transistors 207 and 208 relative to the transistors of the 6T core cell 102. Further, the increased Idrive may be enhanced with respect to the read transistors (e.g., 207, or 207 and 229) with a boosted read wordline voltage 310, as in FIG. 3B.

Figure 9A:
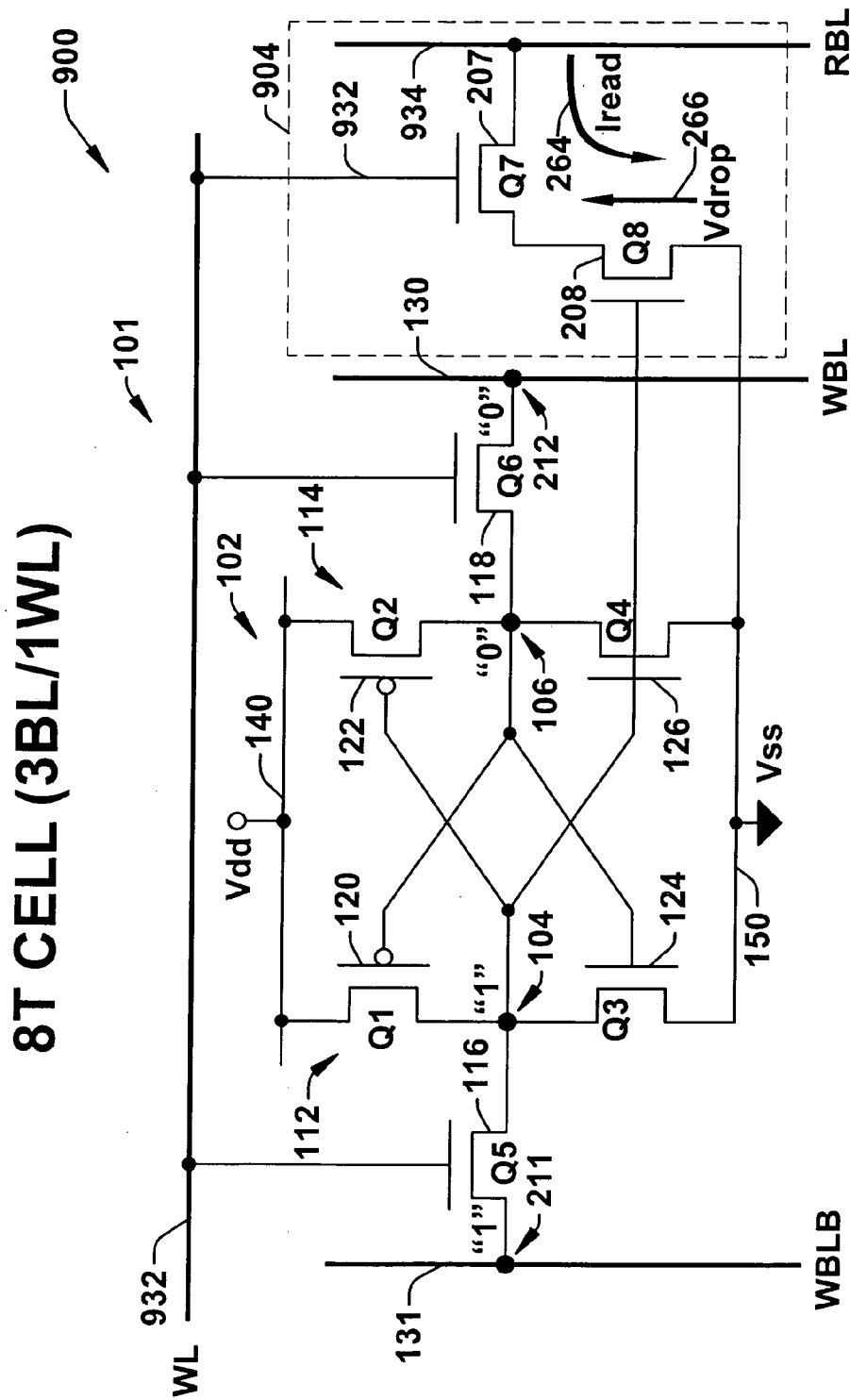
FIG. 9A is a schematic diagram of an alternate embodiment of a single sided 8T SRAM cell, having a read buffer to isolate the read current from a data node of the 6T SRAM cell similar to that of FIG. 1A during a read operation, wherein the read transistor of the read buffer and the write transistor of the core cell share a common word line, according to another aspect of the present invention.

FIG. 9A illustrates an alternate embodiment of a single sided 8T SRAM cell 900, having a read buffer to isolate the read current from a data node of the 6T SRAM cell similar to that of FIG. 1A during a read operation, wherein the read transistor of the read buffer and the write transistor of the core cell share a common word line, according to another aspect of the present invention.

Similar to the 8T SRAM cell 200 of FIG. 2A, the 8T SRAM cell 900 of FIG. 9A comprises a data cell or core cell 102 as part of a conventional 6T SRAM cell 101, and a read buffer 904. Read buffer 904, like read buffer 204 comprises a read transistor 207 and a read driver transistor 208 series connected between a read bitline RBL 934 and a source voltage 150. Unlike read buffer 204, however, read buffer 904 has the read transistor 207 gated by a shared wordline WL 932, which therefore jointly controls read and write operations with a shared wordline signal. Although, this system has the advantage of one less wordline than the cells previously described in the context of the present invention, the read transistor 207 cannot take advantage of a beneficial read boosted voltage while holding the wordline for the core cell 102 to a low or Vss voltage. However, the circuit of SRAM cell 900 still has the advantage of having an isolated and increased read current Iread capability such as by wider width, shorter gate length, or lower Vt transistors in the read circuit compared to the transistors in the core 6T cell 101, with the potentially faster read access time previously described.

Figure 9B:
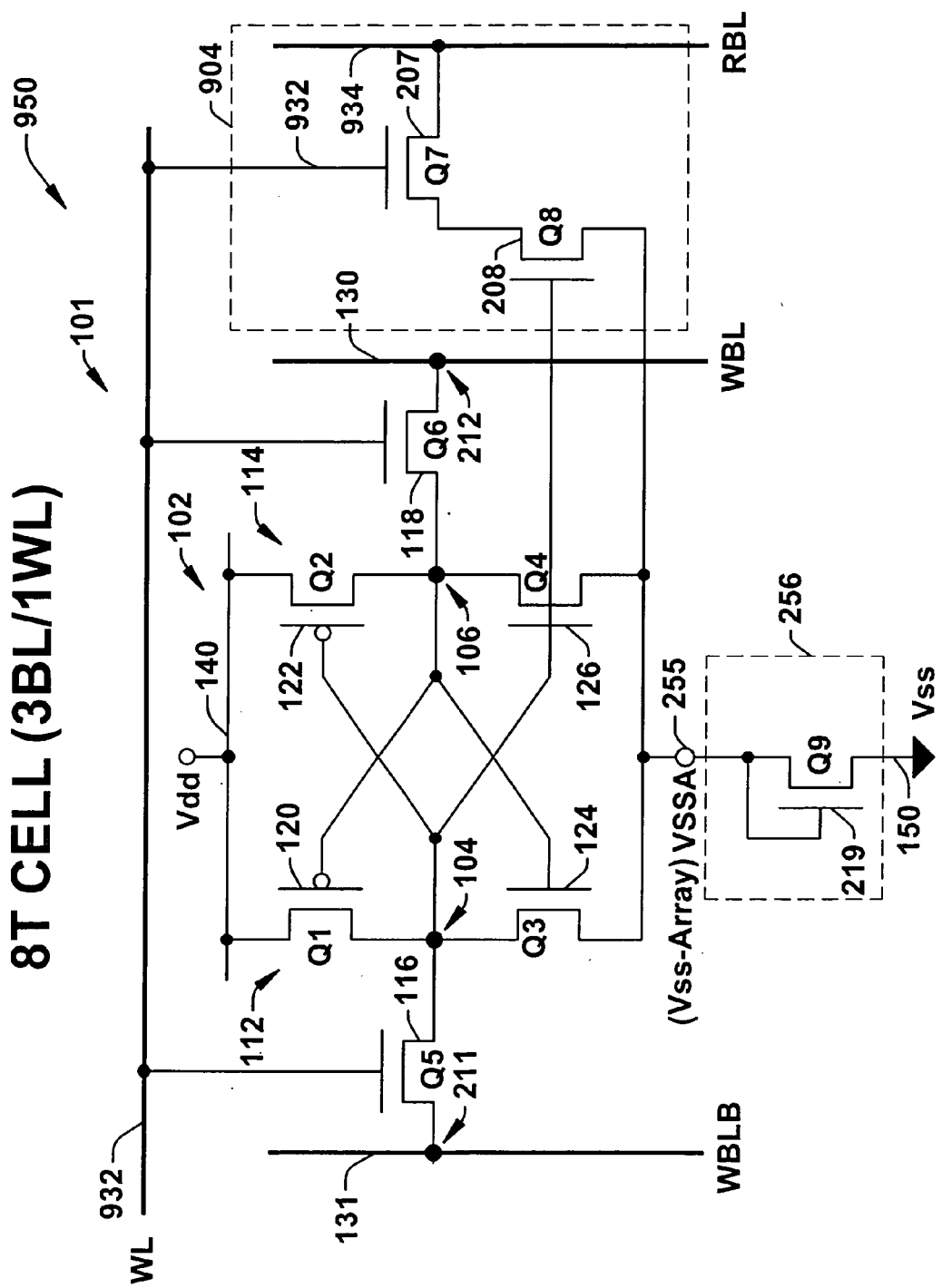
FIG. 9B is a schematic diagram of an alternate embodiment of a single sided 9T SRAM cell, similar to the 8T SRAM cell of FIG. 9A, further comprising a Vss clamp diode connected between a source terminal of the core cell and a source voltage (Vss), according to one or more aspects of the present invention.

FIG. 9B illustrates an alternate embodiment of a single sided 8T SRAM cell 950, similar to the 8T SRAM cell 900 of FIG. 9A, further comprising a Vss clamp diode connected between a source terminal of the core cell and a source voltage (Vss), according to one or more aspects of the present invention. The 8T SRAM cell 950 of FIG. 9B combines some of the features of those of FIG. 2B and those of FIG. 9A, and as such need not be fully described again for the sake of brevity. Again, cell 950 comprises a latch 102 that uses the read buffer having read driver transistor Q8 208 and read transistor Q7 207 to remove the read current (e.g., Iread 264) from the first or second data nodes 104 and 106, respectively, during a read operation. The read buffer 904 of cell 950 again comprises a read transistor 207 and a read driver transistor 208 series connected between a read bitline RBL 934 and a source voltage 150. Also, read buffer 904 has the read transistor 207 gated by a shared wordline WL 932, which therefore jointly controls read and write operations with a shared wordline signal.

Additionally, cell 950 adds a transistor Q9 219 as a VSS clamp diode connected between a source terminal (e.g., Vss-Array 255) of the core or data cell 102 and a source voltage Vss 150. Transistor Q9 219 may be shared among the many 8T cells 250 in an SRAM array, such as array 290 of FIG. 2E. More generally, a VSSA is supplied to the array, where VSSA is >VSS of the write BL driver. Thus, the BL can be driven lower or negative relative to VSSA. In this embodiment of the present invention, the array-Vss 255 may be raised in conjunction with a relatively low write word line voltage 932 to enable a WRITE without upset of cells in unaddressed columns. For read operations, the read WL can be high relative to the write WL voltage to compensate for the impact of a raised Vss (e.g., Vss-Array 255) on the read current (e.g., Iread 264).

For example, the Vss is raised to VSSA by a Vss supply circuit 256, such as by Q9 219 used as a clamp diode. Alternately, a Vss supply circuit 256, such as transistor Q9 219 may be included in every SRAM memory cell 250 of the array as is illustrated in array 280 of FIG. 2D.

The exemplary 8T SRAM cell 950 embodiment of FIG. 9B comprises three bitlines (e.g., write bitline WBL 130, write bitline bar WBLB 131, and read bitline RBL 934) and one wordline (e.g., word line WL 932) or (3BL/1WL). Note that in this embodiment, however, that the read WL is unable to compensate for the high VSSA impact on the read current, because the read and write wordlines are not separate to provide a relatively higher voltage on the read WL than the write wordline.

Other such cell and transistor technology variations, including array orientation variations are anticipated in the context of the present invention.

The invention is also not limited to the use of silicon wafers, and may be implemented in association with the manufacture of various semiconductor devices, SRAM memory devices, or other such devices, wherein the design and optimization of an SRAM cell, potential data upsets, and power consumption is an issue, where cell access is to be limited only to the memory area being used, wherein cell size and patterning considerations are problematic, and wherein the various aspects thereof may be applied.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and/or the claims, such terms are intended to be inclusive in a manner similar to the term "comprising."

What is claimed is:

1. Circuitry for writing to and reading from an SRAM cell core of an array of SRAM cells, comprising:
    a write circuit coupled to the SRAM cell core including a write transistor having an electrical characteristic; and
    a read circuit coupled to the SRAM cell core including a read transistor and a read driver transistor series coupled between a read bit line and a voltage source, the read driver transistor having an electrical characteristic that differs from the electrical characteristic of a driver transistor of the core cell, wherein the electrical characteristic comprises a gate length, the read driver transistor having a shorter gate length than the driver transistor of the core cell, and wherein a gate of the read driver transistor is coupled to an output of the cell core.

2. The circuitry of claim 1, wherein the write transistor and the read transistor have different gate signals.

3. The circuitry of claim 1, wherein the electrical characteristic further comprises a maximum drive current, the read driver transistor having a greater maximum drive current than the driver transistor of the core cell.

4. The circuitry of claim 1, wherein the electrical characteristic further comprises a threshold voltage, the read driver transistor having a lower threshold voltage than a driver transistor of the core cell.

5. The circuitry of claim 1, wherein the SRAM cell comprises:
    a first inverter comprising a first load transistor and a first driver transistor, the first inverter having an input and an output; and
    a second inverter, cross-coupled with the first inverter, comprising a second load transistor and a second driver transistor, the second inverter having an input and an output.

6. The circuitry of claim 5, wherein the circuitry comprises a read transistor and a complementary read transistor.

7. The circuitry of claim 6, further comprising:
    a read driver transistor, a gate of the read driver transistor coupled to the output of the first inverter, and a drain of the read driver transistor coupled to a source of the read transistor; and
    a complementary read driver transistor, a gate of the complementary read driver transistor coupled to the output of the second inverter, and a drain of the complementary read driver transistor coupled to a source of the complementary read transistor.

8. The circuitry of claim 1, further comprising a Vss voltage and a Vss-array voltage, wherein the Vss-array voltage is applied to a source terminal of the core cells of the array.

9. The circuitry of claim 8, wherein the Vss-array voltage is greater than the Vss voltage.

10. The circuitry of claim 9, further comprising a Vss supply circuit having a voltage drop element connected between a source terminal of the core cell of the array (Vss-array) and a source voltage (Vss).

11. The circuitry of claim 10, wherein the voltage drop element is a transistor connected as a diode.

12. The circuitry of claim 8, wherein Vss is applied to a write bitline driver circuit used to drive the write bit line.

13. The circuitry of claim 1, wherein the gate of the read transistor is connected to a read word line associated with a row of cells, the read word line operable to control access to the cells in the row during a read operation.

14. An SRAM cell comprising:
    a pair of cross-coupled inverters supplied by a voltage VDD;
    a write transistor gated by a write word line and coupled between the output of one of the cross-coupled inverters and a write bit-line; and
    a read transistor gated by a read word line and coupled between a read bit-line and a read driver transistor, wherein the read driver transistor is coupled between the read transistor and a source voltage, and is gated by an output of one of the cross-coupled inverters, wherein the read driver transistor and a driver transistor of one of the cross-coupled inverters have an electrical characteristic that differs, and wherein the electrical characteristic comprises a gate length, the read driver transistor having a shorter gate length than the driver transistor of the one of the cross-coupled inverters.

15. The SRAM cell of claim 14, wherein the write word line is separate from the read word line.

16. The SRAM cell of claim 14, wherein the electrical characteristic further comprises a maximum drive current, the read transistor having a greater maximum drive current than the write transistor.

17. The SRAM cell of claim 14, wherein the electrical characteristic further comprises a threshold voltage, the read driver transistor having a lower threshold voltage than the driver transistor of one of the cross-coupled inverters.

18. The SRAM cell of claim 14, wherein the read driver transistor and a driver transistor of one of the cross-coupled inverters are formed adjacent to each other on a semiconductor substrate and have a common gate structure.

19. The SRAM cell of claim 14, wherein the read transistor has a lower threshold voltage or a shorter gate length than the write transistor.

* * * * *